(12) United States Patent
Onoya

(10) Patent No.: US 7,623,106 B2
(45) Date of Patent: *Nov. 24, 2009

(54) SEMICONDUCTOR DEVICE AND METHOD OF DRIVING SEMICONDUCTOR DEVICE

(75) Inventor: Shigeru Onoya, Kanagawa-Ken (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 559 days.

This patent is subject to a terminal disclaimer.

(21) Appl. No.: 11/459,762

(22) Filed: Jul. 25, 2006

(65) Prior Publication Data

US 2006/0267898 A1 Nov. 30, 2006

Related U.S. Application Data

(63) Continuation of application No. 09/778,761, filed on Feb. 8, 2001, now Pat. No. 7,098,884.

(30) Foreign Application Priority Data

Feb. 8, 2000 (JP) ............................. 2000-031055

(51) Int. Cl.
*G09G 3/36* (2006.01)
(52) U.S. Cl. .......................................... 345/96; 345/54
(58) Field of Classification Search .................. 345/87, 345/94, 96, 89, 208, 209, 54, 58
See application file for complete search history.

(56) References Cited

U.S. PATENT DOCUMENTS

| | | | |
|---|---|---|---|
| 4,926,168 A | 5/1990 | Yamamoto | |
| 5,093,655 A | 3/1992 | Tanioka | |
| 5,365,284 A | 11/1994 | Matsumoto | |
| 5,414,443 A | 5/1995 | Kanatani | |
| 5,436,747 A | 7/1995 | Suzuki | |
| 5,528,256 A | 6/1996 | Erhart | |
| 5,615,023 A | 3/1997 | Yang | |
| 5,643,826 A | 7/1997 | Ohtani | |
| 5,790,092 A | 8/1998 | Moriyama | |
| 5,808,596 A | 9/1998 | Kim | |
| 5,844,538 A | 12/1998 | Shiraki | |
| 5,892,493 A | 4/1999 | Enami | |
| 5,923,962 A | 7/1999 | Ohtani | |
| 6,011,530 A | 1/2000 | Kawahata | |
| 6,046,717 A | 4/2000 | Taniguchi | |

(Continued)

OTHER PUBLICATIONS

Japanese Patent Application Laid-Open No. 07-130652 (English Abstract attached), May 19, 1995.

(Continued)

*Primary Examiner*—Amare Mengistu
*Assistant Examiner*—Yuk Chow
(74) *Attorney, Agent, or Firm*—Fish & Richardson P.C.

(57) ABSTRACT

A semiconductor display device with which flicker, vertical striping, and horizontal striping are not easily seen, and a method of driving the semiconductor display device, are provided. Display signals inputted to a plurality of pixel electrodes have a positive or negative polarity based on the electric potential of an opposing electrode, and pixel electrodes to which display signals having a positive polarity are inputted, and pixel electrodes to which display signals having a negative polarity are inputted, differ for each frame period with the method of driving the semiconductor display device.

6 Claims, 23 Drawing Sheets

U.S. PATENT DOCUMENTS

| | | |
|---|---|---|
| 6,049,319 A | 4/2000 | Sakamoto |
| 6,075,505 A | 6/2000 | Shiba |
| 6,087,679 A | 7/2000 | Yamazaki |
| 6,219,019 B1 | 4/2001 | Hasegawa |
| 6,469,684 B1 | 10/2002 | Cole |
| 6,496,172 B1 * | 12/2002 | Hirakata ..................... 345/96 |
| 6,570,553 B2 | 5/2003 | Hashimoto |
| 6,680,722 B1 | 1/2004 | Hiraki |
| 7,098,884 B2 * | 8/2006 | Onoya ........................ 345/96 |
| 2003/0043105 A1 | 3/2003 | Hirakata |

OTHER PUBLICATIONS

Japanese Patent Application Laid-Open No. 11337975 (English Abstract attached), Dec. 10, 1999.

* cited by examiner

Fig.7 first frame period

| | Sp | S(p+1) | S(p+2) | S(p+3) | S(p+4) | S(p+5) | S(p+6) | S(p+7) | S(p+8) | S(p+9) | S(p+10) | S(p+11) | S(p+12) |
|---|---|---|---|---|---|---|---|---|---|---|---|---|---|
| Gq | − | + | − | + | − | − | − | − | − | + | − | + | − |
| G(q+1) | − | + | − | + | − | − | − | − | − | − | − | − | + |
| G(q+2) | + | − | + | + | + | + | − | − | − | + | + | − | + |
| G(q+3) | + | − | + | − | + | + | − | − | + | − | + | − | + |
| G(q+4) | − | − | + | + | + | − | − | + | + | + | − | − | + |
| G(q+5) | − | + | − | + | + | − | + | + | − | + | − | + | − |
| G(q+6) | − | + | + | + | − | − | − | + | + | + | − | + | − |
| G(q+7) | + | + | + | + | + | − | − | + | − | − | + | − | − |
| G(q+8) | + | + | − | + | + | − | + | + | + | + | + | + | + |
| G(q+9) | − | + | + | + | − | + | − | + | + | − | − | + | − |
| G(q+10) | + | + | − | + | − | + | + | − | − | − | − | − | − | second frame period third frame period fourth frame period

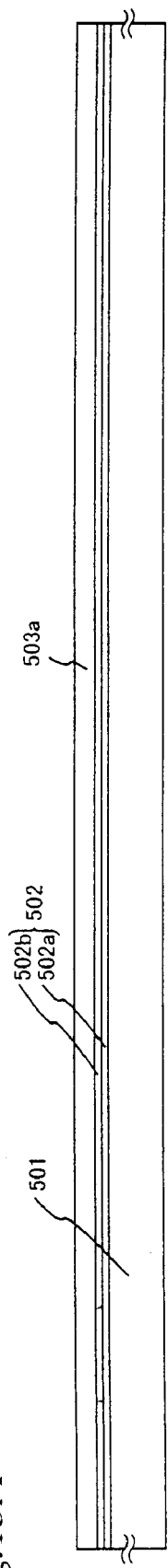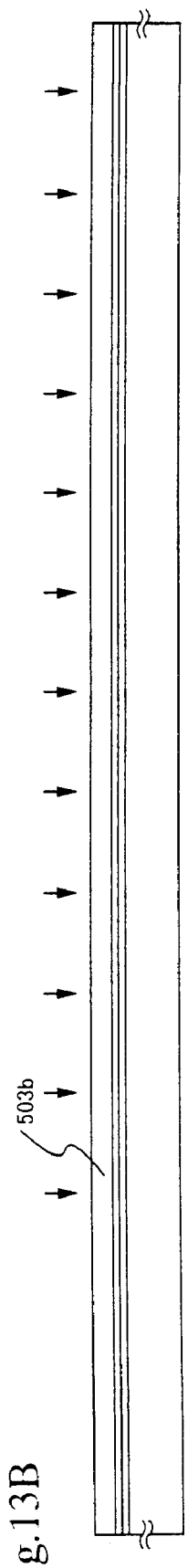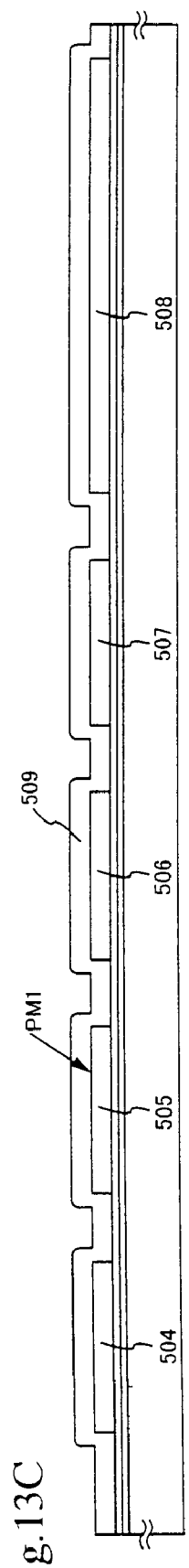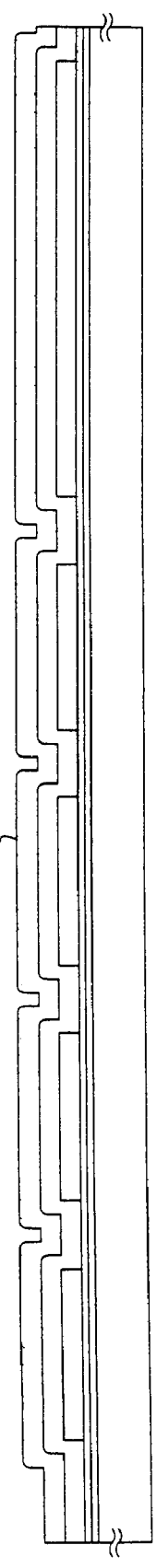

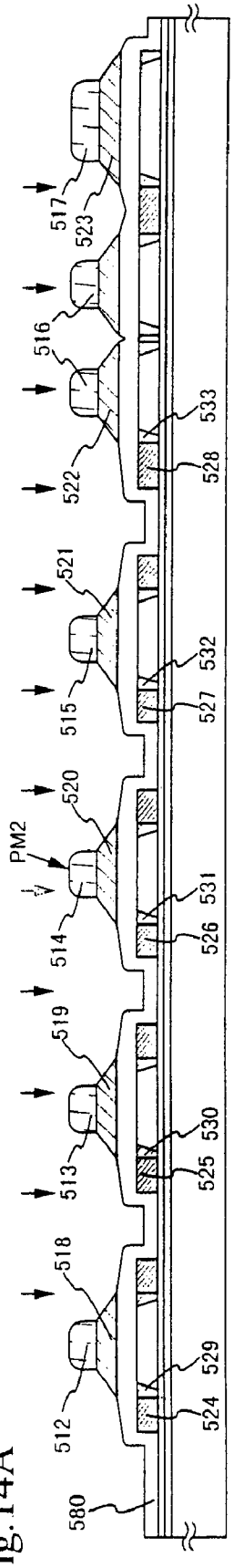
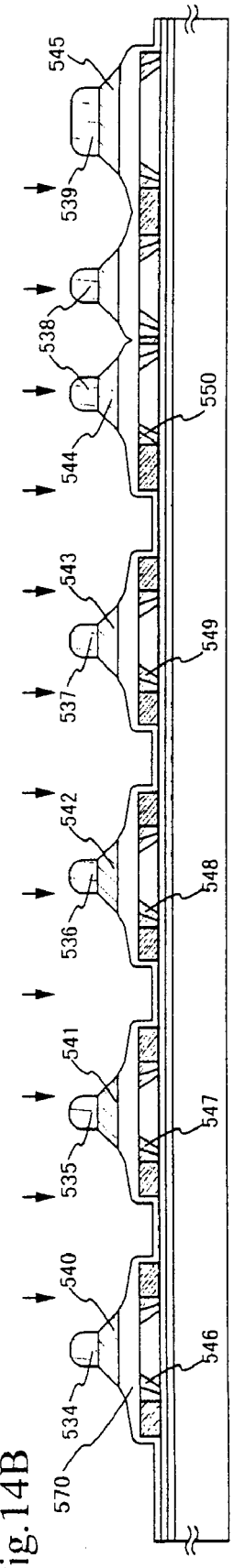
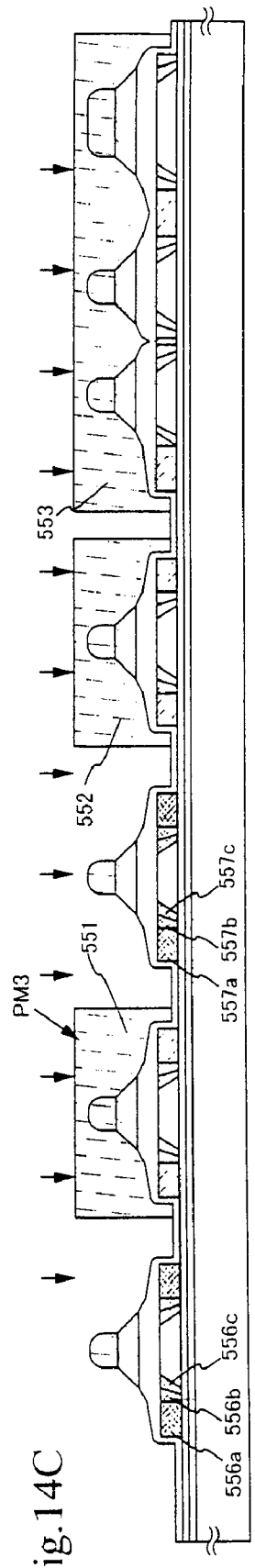
Fig.14A
Fig.14B
Fig.14C

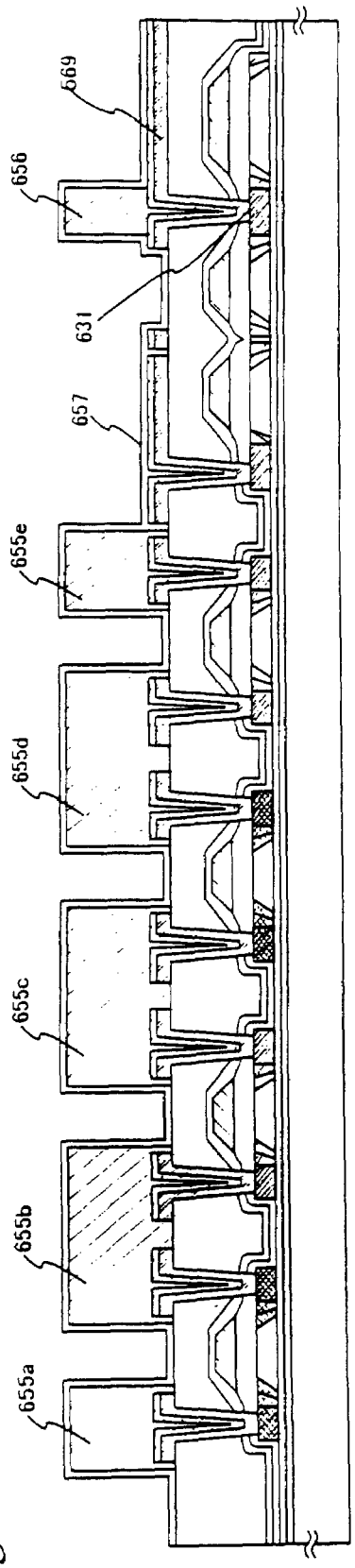
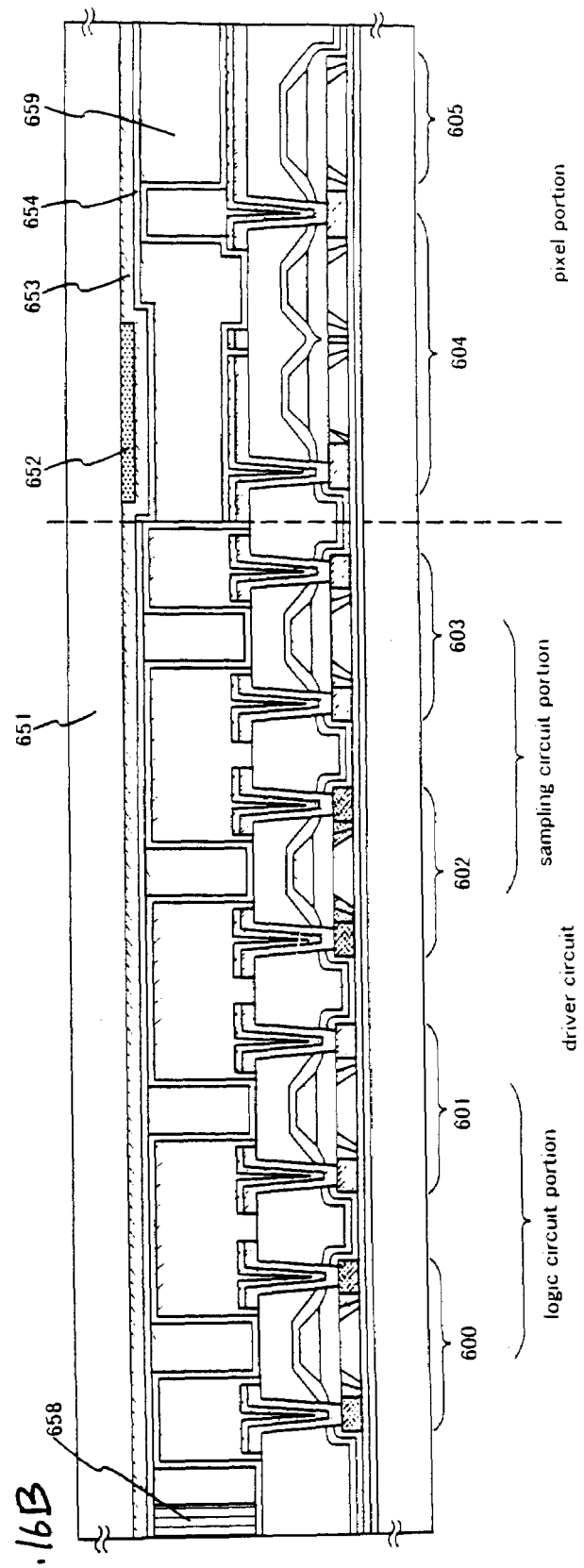

polarity pattern 1    polarity pattern 2 polarity pattern 3    polarity pattern 4 polarity pattern 5    polarity pattern 6 polarity pattern 7    polarity pattern 8

PRIOR ART

SEMICONDUCTOR DEVICE AND METHOD OF DRIVING SEMICONDUCTOR DEVICE

BACKGROUND OF THE INVENTION

1. Field of the Invention

The present invention relates to a very suitable driving method for a semiconductor display device using a display medium such as liquid crystals, and to a semiconductor display device which performs display using the driving method. In particular, the present invention relates to a method of driving an active matrix liquid crystal display device, and to an active matrix liquid crystal display device which performs display using the driving method.

2. Description of the Related Art

Techniques of manufacturing an element formed using a semiconductor thin film on an insulating substrate, a thin film transistor (TFT) for example, have been rapidly developing in recent years. The reason for the demand is that the demand for semiconductor display devices (typically active matrix liquid crystal display devices) has risen.

Active matrix liquid crystal display devices display an image by controlling electric charges applied to several hundreds of thousands to several millions of pixels, arranged in a matrix shape, with pixel switching elements (pixel TFTs) structured by TFTs.

Note that, throughout this specification, pixels are mainly structured by a switching element, a pixel electrode connected to the switching element, an opposing electrode, and liquid crystal formed between the pixel electrode and the opposing electrode.

A general example of the display operation of an active matrix liquid crystal display device is explained simply below with reference to FIGS. 20A and 20B. FIG. 20A is a top view of a liquid crystal panel, and FIG. 20B is a diagram showing pixel arrangement.

A source signal line driver circuit 701 is connected to source signal lines S1 to S6. Further, a gate signal line driver circuit 702 is connected to gate signal lines G1 to G4. A plurality of pixels 703 are formed in portions surrounded by the source signal lines S1 to S6 and the gate signal lines G1 to G4. Pixel TFTs 704 and pixel electrodes 705 are formed in the pixels 703. Note that the number of source signal lines and the number of gate signal lines are not limited to these values.

A display signal is inputted to the source signal line S1 in accordance with a signal from a circuit such as a shift register (not shown in the figures) within the source signal line driver circuit 701. Further, the gate signal line G1 is selected in accordance with a selection signal inputted to the gate signal line G1 from the gate signal line driver circuit 702, and the pixel TFT 704 of a pixel (1,1), at which the gate signal line G1 and the source signal line S1 intersect, turns on. The display signal inputted to the source signal line S1 is then inputted to the pixel electrode 705 of the pixel (1,1) through the pixel TFT 704. The liquid crystal is driven in accordance with the electric potential of the inputted display signal, the amount of transmitted light is controlled, and a portion of an image (the image corresponding to the pixel (1,1)) is displayed in the pixel (1,1).

Next, with the state, in which the portion of the image in the pixel (1,1) is displayed, maintained by means such as a storage capacitor (not shown in the figures), a display signal is inputted to the source signal line S2 in the next instant in accordance with a signal from the shift register or the like (not shown in the figures) within the source signal line driver circuit 701. Note that the storage capacitor is a capacitor for storing the electric potential of the display signal inputted to the gate electrode of the pixel TFT 704 for a fixed period.

The gate signal line G1 is maintained as is, selected, and the pixel TFT 704 of a pixel (1,2), at which the gate signal line G1 and the source signal line S2 intersect, turns on. The image signal inputted to the source signal line S2 is then inputted to the pixel electrode 705 of the pixel (1,2) through the pixel TFT 704. The liquid crystal is then driven in accordance with the electric potential of the inputted display signal, the amount of light transmitted is controlled, and a portion of the image (the image corresponding to the pixel (1,2)) is displayed in the pixel (1,2), similar to the pixel (1,1).

The above display operations are performed one after another, and portions or the image are displayed in succession in all of the pixels (1,1), (1,2), (1,3), (1,4), (1,5), and (1,6) connected to the gate signal line G1. The gate signal line G1 continues to be selected in accordance with the selection signal inputted to the gate signal line G1 during this period.

The gate signal line G1 is deselected when the display signal is inputted to all of the pixels connected to the gate signal line G1. Continuing, the gate signal line G2 is selected in accordance with a selection signal inputted to the gate signal line G2. Portions of the image are then displayed in succession in all of the pixels (2,1), (2,2), (2,3), (2,4), (2,5), and (2,6) connected to the gate signal line G2. The gate signal line G2 continues to be selected during this period.

One image is displayed in a pixel portion 706 by repeating the above stated operations for all of the gate signal lines. A period in which the one image is displayed is referred to as one frame period. The period during which one image is displayed in the pixel portion 706, and a vertical return period may also be taken together as the frame period. All of the pixels are maintained in a state of displaying the image by means such as a storage capacitor (not shown in the figures) until the pixel TFT of each pixel is again turned on.

In a liquid crystal panel using a component such as a TFT as a switching element, the polarity of the electric potential of the signal inputted to each pixel is normally inverted (alternating current drive) with the electric potential of the opposing electrode (common electric potential) as a standard in order to prevent degradation of the liquid crystal. Frame inverting drive, source line inverting drive, gate line inverting drive, and dot inverting drive can be given as methods of alternating current drive. Each of the driving methods is explained below.

A polarity pattern of a display signal inputted to each pixel in frame inverting drive is shown in FIG. 21A (hereafter referred to simply as a polarity pattern). Note that, with a common electric potential as a standard, "+" is shown when an electric potential of a display signal inputted to a pixel is positive, while "−" is shown when an electric potential of a display signal inputted to a pixel is negative in the figures showing polarity patterns in this specification (FIGS. 21A to 21D, FIG. 2, FIG. 4, FIG. 5, FIG. 6, and FIG. 7). Further, the polarity patterns shown in FIGS. 21A to 21D correspond to the pixel arrangement shown in FIG. 20B.

Note that, throughout this specification, a display signal having a positive polarity denotes a display signal having an electric potential which is higher than the common electric potential. Further, a display signal having a negative polarity denotes a display signal having an electric potential which is lower than the common electric potential.

Regarding a method of scanning, there is: interlaced scanning in which scanning is divided into two times (two fields), one for odd numbered gate signal lines and one for even numbered gate signal lines; and non-interlaced scanning in which the odd numbered and even numbered gate signal lines are scanned in order without being divided, in one image (one frame). Examples in which mainly non-interlaced scanning is used are explained here.

With frame inverting drive, the display is performed so that display signals having, an identical polarity are inputted to all of the pixels within one arbitrary frame period (polarity pattern 1), and the polarity of the display signals inputted to all of the pixels is inverted in the next frame period (polarity pattern 2). Namely, focusing on only the polarity pattern, the frame inverting drive is a driving method in which two types of polarity patterns (the polarity pattern 1 and the polarity pattern 2) are repeated every other frame period and the display is performed.

Source line inverting drive is explained next. Polarity patterns of pixels in the source line inverting drive are shown in FIG. 21B.

With source line inverting drive, display signals having the same polarity are inputted to all pixels connected to the same source signal line in one arbitrary frame period as shown in FIG. 21B, and display signals having the inverse polarity are inputted to pixels connected to adjacent source signal lines.

Note that, in this specification, pixels connected to a source line denotes pixels having pixel TFTs in which a source region or a drain region is connected to the source signal line.

Then, in the next frame period, display signals having the polarity that is the reverse of the display signals inputted in the previous one frame period, are inputted to each source signal line. Therefore, if a polarity pattern in an arbitrary frame period is taken as polarity pattern 3, then the polarity pattern in the next frame period becomes polarity pattern 4.

Gate line inverting drive is explained next. Polarity patterns in gate line inverting drive are shown in FIG. 21C.

As shown in FIG. 21C, display signals having the same polarity are inputted to all pixels connected to the same gate signal line during one arbitrary frame period in gate line inverting drive, and display signals having the reverse polarity are inputted to pixels connected to adjacent gate signal lines.

Note that, in this specification, pixels connected to a gate signal line denotes pixels having pixel TFTs whose gate electrode is connected to the gate signal line.

Then, in the next frame period, display signals having the inverse polarity to the display signals inputted in the previous frame period are inputted to pixels connected to each gate signal line. Therefore, if a polarity pattern in one arbitrary frame period is taken as polarity pattern 5, then the polarity pattern in the next frame period becomes frame pattern 6.

In other words, similar to source line inverting drive, the gate line inverting drive is a driving method in which two types of polarity patterns (polarity pattern 5 and polarity pattern 6) are repeated every other frame period, and display is performed.

Dot inverting drive is explained next. Polarity patterns in dot inverting drive are shown in FIG. 21D.

Dot inverting drive is a driving method in which the polarity of display signals inputted to the pixels is inverted for all adjacent pixels, as shown in FIG. 21D. Then, in one arbitrary frame period, display signals having polarities which are inverse to those of the previous frame period are inputted to each pixel. Therefore, if the polarity pattern occurring in one arbitrary frame period is taken as polarity pattern 7, then the polarity pattern of the next frame period becomes polarity pattern 8. In other words, the dot inverting drive is a driving method in which two types of polarity patterns are repeated every other frame period and display is performed.

The above alternating current drives are useful methods for preventing deterioration of the liquid crystal. However, when using the above alternating current drives, the screen flickers, and vertical striping or horizontal striping is visible.

It is considered that this is because the screen brightness differs subtly between inputted display signals of the positive polarity and those the negative polarity when performing the same gray-scale display in each pixel. This phenomenon is explained in detail below taking frame inverting drive as an example.

A timing chart when performing frame inverting drive for the active matrix liquid crystal display device of FIGS. 20A and 20B is shown in FIG. 22. Note that FIG. 22 is a timing chart of a case in which white display is performed provided that the liquid crystal display device is normally black, and black display is performed when normally white. A period during which a selection signal is inputted to one gate signal line is taken as one line period, and a period during which the selection signal is inputted to all gate signal lines and one image is displayed is taken as one frame period.

When a display signal and a selection signal are inputted to the source signal line S1 and the gate signal line G1, respectively, a display signal of a positive polarity is inputted to the pixel (1,1) provided in a portion at which the source signal line S1 and the gate signal line G1 intersect. Note that, in this specification, a display signal being inputted to a pixel denotes the display signal being inputted to the pixel electrode through the pixel TFT. The electric potential applied to the pixel electrode in accordance with the inputted display signal then ideally continues to be maintained throughout one frame period by means such as a storage capacitor.

In practice, however, if the electric potential of the gate signal line G1, when one line period is completed, shifts to an electric potential which makes the pixel TFT to be turned off, the electric potential of the pixel electrode may also be caused to change by an amount ΔV in the direction of the shift of the electric potential of the gate signal line G1. This phenomenon is referred to as field-through, and ΔV is referred to as penetration voltage.

The voltage ΔV is given by the following equation:

$$\Delta V = V \times Cgd/(Cgd + Clc + Cs). \quad [\text{Eqn. 1}]$$

Note that V is the amplitude of the electric potential of the gate electrode. Cgd is the capacitance between the gate electrode and the drain region of the pixel TFT. Clc is the capacitance of the liquid crystal between the pixel electrode and the opposing electrode, and Cs is the capacitance of the storage capacitor.

In the timing chart of FIG. 22, the actual electric potential of the pixel electrode in the pixel (1,1) is shown by a solid line, and the electric potential of an ideal pixel electrode in which field-through is not considered is shown by a dotted line. In the first frame period, a display signal of a positive polarity is input to the pixel (1,1). The electric potential or the ante signal line changes to negative at the same time as the first line period is completed in the case of the first frame period shown in FIG. 22, and the electric potential of the pixel electrode of the pixel (1,1) also in practice changes in the negative direction by the amount of penetration voltage. Note that the penetration voltage in the first frame period is denoted by ΔV1 in FIG. 22.

Next, in a first line period of a second frame period, a display signal having a negative polarity, the inverse of the polarity of the first line period of the first frame period, is inputted to the pixel (1,1). When the first line period in the second frame period is then complete, the electric potential of the gate signal line G1 then changes in the negative direction. At the same time, the pixel electrode electric potential of the pixel (1,1) also changes in the negative direction by the amount of penetration voltage. Note that the penetration voltage in the second frame period is denoted by $\Delta V2$ in FIG. 22.

The driver voltage after completion of the first line period of the first frame period is denoted by V1, and the driver voltage after completion of the first line period of the second frame period is denoted by V2 in FIG. 22. Note that, in this specification, driver voltage refers to the potential difference between the electric potential of a pixel electrode and the common electric potential.

The driver voltage V1 and the driver voltage V2 have the difference of $\Delta V1+\Delta V2$. The screen brightness of the pixel (1,1) therefore differs between the first frame period and the second frame period.

A method of reducing a value of the common electric potential has also be considered in order that the driver voltage V1 and the driver voltage V2 will become the same.

However, the capacitance Cgd between the gate electrode and the drain region oft the pixel TFT differs between when a display signal having a positive polarity is inputted to the pixel and when a display signal having a negative polarity is inputted to the pixel. In addition, the capacitance Clc of the liquid crystal between the pixel electrode and the opposing electrode fluctuates in accordance with the electric potential of the display signal inputted to the pixel. The values of Cgd and Clc thus differ in accordance with each frame period, and therefore the value of the penetration voltage $\Delta V$ also differs for each frame period. Consequently, even if the value of the common electric potential is changed, the driver voltage in the pixel (1,1) differs in accordance with the frame period, and as a result, the screen brightness differs.

This is a phenomenon which is not limited to the pixel (1,1), and occurs in all of the pixels, and the brightness of the pixels differs according to the polarity of the display signal inputted to the pixels.

With frame inverting drive, therefore, the brightness of an image displayed in the first frame period and that of an image displayed in the second frame period differ, and this is seen as flicker by an observer. In particular, a remarkable amount of flicker has been confirmed in intermediate gray-scale display.

The display brightness of pixels into which a display signal of a positive polarity is inputted also differs from that of pixels into which a display signal of a negative polarity is inputted, in cases of source line inverting drive, gate line inverting drive, and dot inverting drive.

As a result, vertical stripes are displayed on the screen by source line inverting drive, and horizontal stripes are displayed on the screen by gate line inverting drive. Further, vertical stripes and horizontal stripes appear with dot inverting drive depending upon the image displayed in the screen.

It is considered that increasing the frame frequency is effective in preventing observable screen flicker, and vertical and horizontal striping due to alternating current from being seen. However, it is necessary to increase the driving frequency of the driver circuit, in particular the driving frequency of the source signal line driver circuit, in order to increase the frame frequency. If the driving frequency of the source signal line driver circuit is then increased, there is the possibility that the operating speed of the TFTs of the source signal line driver circuit is unable to respond to the driving frequency of the source signal line driver circuit, and operation thus becomes impossible, or difficulties arise relating to reliability.

SUMMARY OF THE INVENTION

In view of the above, an object of the present invention is to provide a method of driving a semiconductor display device which is capable of displaying a clear, high definition image, in which flicker, vertical striping, and horizontal striping are difficult to be observed by a viewer, and to provide a semiconductor display device using the driving method.

The applicant of the present invention considers that the observation of flicker, vertical striping, and horizontal striping by a viewer in performing alternating current driving derives from the fact that, among a plurality of pixels in a pixel portion, pixels to which display signals having the same polarity are inputted always remain the same in every frame period. Specifically, this is because, when display signals mutually having the same polarity are inputted to pixels in a certain frame period, display signals mutually having the same polarity are also inputted to the same pixels in other frame periods.

When performing alternating current drive of a semiconductor display device with the present invention, pixels to which display signals having the same polarity are inputted are made so as not to always be the same in each frame period. In other words, pixels to which display signals having the same polarity are inputted are changed irregularly in a certain fixed period, to the extent that flicker, vertical striping, and horizontal striping become difficult to observe. Note that pixels to which the same polarity display signals are inputted may be changed irregularly so that flicker, vertical striping, and horizontal striping become difficult to observe in an image, and may be changed with a certain, fixed regularity.

Then, within a certain period, periods during which display signals of a positive polarity are inputted to each pixel and periods during which display signals of a negative polarity are inputted to each pixel are made to become equal.

In performing alternating current drive, the frequency of a driver circuit can be suppressed, and flicker, vertical striping, and horizontal striping observed on the screen by the viewer can also be suppressed by using the above structure. Moreover, degradation of the liquid crystal can be suppressed by alternating current drive.

Structures of the present invention are shown below.

In accordance with the above constitution, the present invention provides a method of driving a semiconductor display device having: a plurality of pixels, each containing a pixel TFT and a pixel electrode; an opposing electrode; and a liquid crystal formed between the plurality of pixel electrodes and the opposing electrode;

characterized in that:

display signals are inputted to the plurality of pixel electrodes through the plurality of pixel TFTs;

the display signals inputted to the plurality of pixel electrodes have positive or negative polarities, with the electric potential of the opposing electrode as a standard; and the pixel electrodes into which display signals having positive polarities are inputted, and the pixel electrodes into which display signals having negative polarities are inputted differ every frame period.

In accordance with the above constitution, the present invention provides a method of driving a semiconductor display device having: a plurality of pixels, each containing a pixel TFT and a pixel electrode; a plurality of source signal lines; a plurality of gate signal lines; an opposing electrode; and a liquid crystal formed between the plurality of pixel electrodes and the opposing electrode;

characterized in that:

switching of the plurality of pixel TFTs is controlled in accordance with a selection signal inputted to the plurality of gate signal lines;

display signals inputted to the plurality of source signal lines are inputted to the plurality of pixel electrodes through the plurality of pixel TFTs;

the display signals inputted to the plurality of pixel electrodes have positive or negative polarities, with the electric potential of the opposing electrode as a standard; and the pixel electrodes into which display signals having positive polarities are inputted, and the pixel electrodes into which display signals having negative polarities are inputted differ every frame period.

In accordance with the above constitution, the present invention provides a method of driving a semiconductor display device having: a plurality of pixels, each containing a pixel TFT and a pixel electrode; a plurality of source signal lines; a plurality of gate signal lines; an opposing electrode; and a liquid crystal formed between the plurality of pixel electrodes and the opposing electrode;

characterized in that:

switching of the plurality of pixel TFTs is controlled in accordance with a selection signal inputted to the plurality of gate signal lines;

display signals inputted to the plurality of source signal lines are inputted to the plurality of pixel electrodes through the plurality of pixel TFTs;

the display signals inputted to the plurality of pixel electrodes have positive or negative polarities, with the electric potential of the opposing electrode as a standard;

the display signals inputted to each of the plurality of source signal lines always have the same polarity, with the electric potential of the opposing electrode taken as a standard, within each frame period; and the pixel electrodes into which display signals having positive polarities are inputted, and the pixel electrodes into which display signals having negative polarities are inputted differ every frame period.

In accordance with the above constitution, the present invention provides a method of driving a semiconductor display device having: a plurality of pixels, each containing a pixel TFT and a pixel electrode; a plurality of source signal lines; a plurality of gate signal lines; an opposing electrode; and a liquid crystal formed between the plurality of pixel electrodes and the opposing electrode;

characterized in that:

switching of the plurality of pixel TFTs is controlled in accordance with a selection signal inputted to the plurality of gate signal lines;

display signals inputted to the plurality of source signal lines are inputted to the plurality of pixel electrodes through the plurality of pixel TFTs;

the display signals inputted to the plurality of pixel electrodes have positive or negative polarities, with the electric potential of the opposing electrode as a standard;

the polarity of all of the display signals inputted to the plurality of source signal lines is the same polarity, with the electric potential of the opposing electrode taken as a standard, within one line period;

the polarities of the display signals inputted to the plurality of source signal lines in adjacent line periods are mutually inverted, with the electric potential of the opposing electrode taken as a standard; and the pixel electrodes into which display signals having positive polarities are inputted, and the pixel electrodes into which display signals having negative polarities are inputted differ every frame period.

In accordance with the above constitution, the present invention provides a semiconductor display device having:

a source signal line driver circuit;
a gate signal line driver circuit;
a plurality of source signal lines;
a plurality of gate signal lines;
a pixel portion; and
a display signal generation portion;
characterized in that:

the pixel portion has a plurality of pixels, each containing a pixel TFT and a pixel electrode;

the display signal generation portion has: a control portion; a polarity data signal generation portion; an alternating current signal generation portion; a display signal selection portion; a + side display signal generation portion; and a − side display signal generation portion;

the control portion controls driving of the polarity data signal generation portion, the alternating current signal generation portion, the source signal line driver circuit, and the gate signal line driver circuit;

the polarity data signal generation portion inputs a polarity data signal having polarity data to the alternating current signal generation portion;

the alternating current signal generation portion generates an alternating current signal in accordance with the polarity data signal and inputs the alternating current signal to the display signal selection portion;

an image signal having positive polarity and an image signal having negative polarity are generated in the + side display signal generation portion and the − side display signal generation portion, respectively, and are inputted to the display signal selection portion;

display signals are generated in the display signal selection portion from the image signal having positive polarity, the image signal having negative polarity, and the alternating current signal, and are inputted to the source signal line driver circuit;

the display signals inputted to the source signal line driver circuit are sampled and inputted to the plurality of source signal lines;

switching of the plurality of pixel TFTs is controlled in accordance with a selection signal inputted to the plurality of gate signal lines;

the display signals inputted to the plurality of source signal lines are inputted to the plurality of pixel electrodes through the plurality of pixel TFTs;

the display signals inputted to the plurality of pixel electrodes have positive or negative polarities, with the electric potential of the opposing electrode taken as a standard; and the pixel electrodes to which the display signals having positive polarity are inputted, and the pixel electrodes to which the display signals having negative polarity are inputted differ every frame period.

In accordance with the above constitution, the present invention provides a semiconductor display device having:

a source signal line driver circuit;
a gate signal line driver circuit;
a plurality of source signal lines;
a plurality of gate signal lines;
a pixel portion;
a gray-scale voltage control portion; and
a gray-scale voltage power source;
characterized in that:

the source signal line driver circuit has a D/A converter circuit;

the pixel portion has a plurality of pixels, each containing a pixel TFT and a pixel electrode;

the gray-scale voltage control portion has a control portion, a polarity data signal generation portion, and an alternating current signal generation portion;

the control portion controls driving of the polarity data signal generation portion, the alternating current signal generation portion, the source signal line driver circuit, and the gate signal line driver circuit;

the polarity data signal generation portion inputs a polarity data signal having polarity data to the alternating current signal generation portion;

the alternating current signal generation portion generates an alternating current signal in accordance with the polarity data signal and inputs the alternating current signal to the gray-scale voltage power source;

a gray-scale voltage inputted to the D/A converter circuit from the gray-scale voltage power source is controlled in accordance with the alternating current signal;

display signals outputted from the D/A converter circuit are sampled and inputted to the plurality of source signal lines;

switching of the plurality of pixel TFTs is controlled in accordance with a selection signal inputted to the plurality of gate signal lines;

the display signals inputted to the plurality of source signal lines are inputted to the plurality of pixel electrodes through the plurality of pixel TFTs;

the display signals inputted to the plurality of pixel electrodes have positive or negative polarities, with the electric potential of the opposing electrode taken as a standard; and the pixel electrodes to which the display signals having positive polarity are inputted, and the pixel electrodes to which the display signals having negative polarity are inputted differ every frame period.

In accordance with the above constitution, the present invention provides a semiconductor display device having:
a source signal line driver circuit;
a gate signal line driver circuit;
a plurality of source signal lines;
a plurality of gate signal lines;
a pixel portion; and
a display signal generation portion,
characterized in that:
the pixel portion has a plurality of pixels, each containing a pixel TFT and a pixel electrode;
the display signal generation portion has: a control portion; an address counter; a polarity data signal generation portion; a memory; an alternating current signal generation portion; a display signal selection portion; a + side display signal generation portion; and a – side display signal generation portion;
the control portion controls driving of the address counter, the alternating current signal generation portion, the source signal line driver circuit, and the gate signal line driver circuit;
an address of the memory is specified in accordance with a counter signal outputted from the address counter;
the polarity data signal generation portion inputs-polarity data stored in the address to the alternating current signal generation portion as a polarity data signal;
the alternating current signal generation portion generates an alternating current signal in accordance with the polarity data signal and inputs the alternating current signal to the display signal selection portion;
an image signal having positive polarity and an image signal having negative polarity are generated in the + side display signal generation portion and the – side display signal generation portion, respectively, and are input to the display signal selection portion;

display signals are generated in the display signal selection portion from the image signal having positive polarity, the image signal having negative polarity, and the alternating current signal, and are inputted to the source signal line driver circuit;

the display signals inputted to the source signal line driver circuit are sampled and inputted to the plurality of source signal lines;

switching of the plurality of pixel TFTs is controlled in accordance with a selection signal inputted to the plurality of gate signal lines;

the display signals inputted to the plurality of source signal lines are inputted to the plurality of pixel electrodes through the plurality of pixel TFTs;

the display signals inputted to the plurality of pixel electrodes have positive or negative polarities, with the electric potential of the opposing electrode taken as a standard; and the pixel electrodes to which the display signals having positive polarity are inputted, and the pixel electrodes to which the display signals having negative polarity are inputted differ every frame period.

In accordance with the above constitution, the present invention provides a semiconductor display device having:
a source signal line driver circuit;
a gate signal line driver circuit;
a plurality of source signal lines;
a plurality of gate signal lines;
a pixel portion;
a gray-scale voltage control portion; and
a gray-scale voltage power source;
characterized in that:
the source signal line driver circuit has a D/A converter circuit;
the pixel portion has a plurality of pixels, each containing a pixel TFT and a pixel electrode;
the gray-scale voltage control portion has a control portion, an address counter, a polarity data signal generation portion, a memory, and an alternating current signal generation portion;
the control portion controls driving of the address counter, the alternating current signal generation portion, the source signal line driver circuit, and the gate signal line driver circuit;
an address of the memory is specified in accordance with a counter signal outputted from the address counter;
the polarity data signal generation portion inputs polarity data stored in the address to the alternating current signal generation portion as a polarity data signal;
the alternating current signal generation portion generates an alternating current signal in accordance with the polarity data signal and inputs the alternating current signal to the gray-scale voltage power source;
a gray-scale voltage inputted to the D/A converter circuit from the gray-scale voltage power source is controlled in accordance with the alternating current signal;
display signals outputted from the D/A converter circuit are sampled and inputted to the plurality of source signal lines;
switching of the plurality of pixel TFTs is controlled in accordance with a selection signal inputted to the plurality of gate signal lines;
the display signals inputted to the plurality of source signal lines are inputted to the plurality of pixel electrodes through the plurality of pixel TFTs;

the display signals inputted to the plurality of pixel electrodes have positive or negative polarities, with the electric potential of the opposing electrode taken as a standard; and the pixel electrodes to which the display signals having positive polarity are inputted, and the pixel electrodes to which the display signals having negative polarity are inputted differ every frame period.

In the above structures in accordance with the present invention Pixel electrodes to which the display signals having positive polarity are inputted, and pixel electrodes to which the display signals having negative polarity are inputted may differ randomly every frame period.

In the above structures according to the present invention, the polarity of the display signals inputted to all of the pixel electrodes may be inverted in two adjacent frame periods.

The polarity data is information regarding the polarity of the display signals inputted to all of the pixels.

BRIEF DESCRIPTION OF THE DRAWINGS

In the accompanying drawings:

FIG. 7 is a diagram showing a pixel polarity pattern in a driving method of the present invention;

FIGS. 13A to 13D are diagrams showing a process of manufacturing a semiconductor display device;

FIGS. 14A to 14C are diagrams showing the process of manufacturing the semiconductor display device;

FIGS. 16A and 16B are diagrams showing a process of manufacturing the semiconductor display device;

DETAILED DESCRIPTION OF THE PREFERRED EMBODIMENTS

A driving method of the present invention is explained below.

Figure 1:
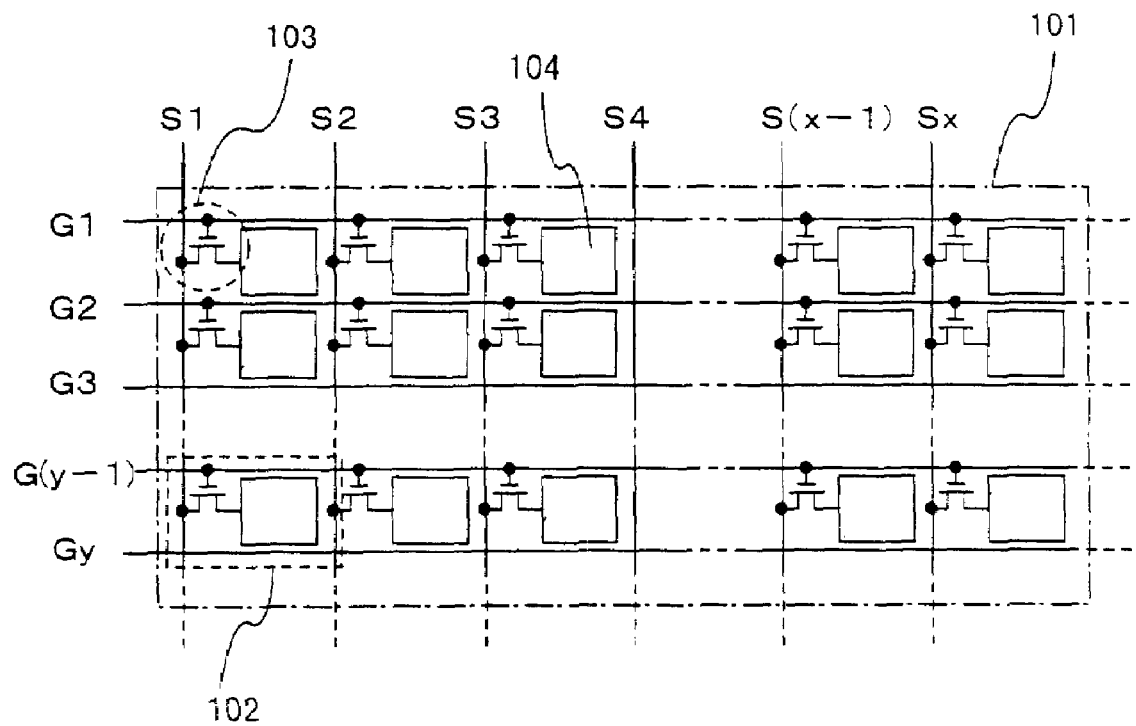
FIGS. 1A and 1B are diagrams showing a top surface view and a pixel arrangement, respectively, of a semiconductor display device.

A structure of a pixel portion of an active matrix liquid crystal display device in which the driving method of the present invention is used is shown in FIGS. 1A and 1B. FIG. 1A is a circuit diagram of the pixel portion, and FIG. 1B is a diagram showing an arrangement of pixels.

Reference numeral 101 denotes a pixel portion. Source signal lines S1 to Sx connected to a source signal line driver circuit (not shown in the figures), and gate signal lines G1 to Gy connected to a gate signal line driver circuit (not shown in the figures) are provided in the pixel portion 101. In the pixel portion 101, pixels 102 are provided at portions surrounded by the source signal lines S1 to Sx and the gate signal lines G1 to Gy. A pixel TFT 103 and a pixel electrode 104 are provided in the pixels 102.

A selection signal is inputted from the gate signal line driver circuit to the gate signal lines G1 to Gy, and switching of the pixel TFTs is controlled in accordance with the selection signal. Note that, in this specification, to control switching of TFTs refers to selecting whether a TFT is in an on state or is in an off state.

The gate signal line G1 is selected in accordance with the selection signal inputted to the gate signal line G1 from the gate signal line driver circuit, and the pixel TFTs 103 of pixels (1,1), (1,2), ..., (1,x) at which the gate signal line G1 and the source signal line S1 intersect, turn on.

Further, display signals are inputted to the source signal lines S1 to Sx in order, or simultaneously, in accordance with a signal from a circuit such as a shift register (not shown in the figures) within the source signal line driver circuit. The display signals inputted to the source signal lines S1 to Sx are then inputted to the pixel electrodes 104 of the pixels (1,1), (1,2), ..., (1,x) through the pixel TFTs 103. Liquid crystals are driven in accordance with the electric potential of the inputted display signals, the amount of light transmitted is controlled, and a portion of an image (corresponding to the pixels (1,1), (1,2), ..., (1,x)) is displayed in the pixels (1,1), (1,2), ..., (1,x).

When the display signals are inputted to all of the pixels connected to the gate signal line G1, and the gate signal line G1 is deselected. Continuing, with the state, in which the portion of the image is displayed in the pixels (1,1), (1,2), ..., (1,x), maintained by a means such as a storage capacitor (not shown in the figure), the gate signal line G2 is selected in accordance with a selection signal inputted to the gate signal line G2. Note that the storage capacitor is a capacitor for storing the electric potential of the display signal inputted to the gate electrodes of the pixel TFTs 103 for a fixed period. Portions of the image are then similarly displayed one after another in all pixels (2,1), (2,2), ..., (2,x) connected to the gate signal line G2. The gate signal line G2 continues to be selected for this period.

One image is displayed in the pixel portion 101 by repeating the above operations in order for all of the gate signal lines. A period during which the one image is displayed is referred to as one frame period. The period during which one image is displayed in the pixel portion 101, and a vertical return period may also be combined and taken as the frame period. A state in which the image is displayed is then maintained by means such as a storage capacitor (not shown in the figures) until once again the pixel TFTs of each pixel are placed in an on state.

With the present invention pixels to which display signal mutually having the same polarity are inputted are not always fixed in every frame period. In other words, the pixels to which the display signals having the same polarity are inputted are changed every certain fixed period so that flicker, vertical striping, and horizontal striping become difficult to observe. Note that the pixels to which the display signals having the same polarity are inputted may be changed irregularly so that flicker, vertical striping, and horizontal striping are difficult to observe in the image, and may also be changed randomly, or be changed with a certain fixed regularity.

Note that, while the above driving method is explained with an example using non-interlaced scanning, the scanning method of the present invention is not limited to this method. Interlaced scanning may also be used.

Driving methods of the present invention are explained in detail below.

Embodiment Mode 1

Figure 2:
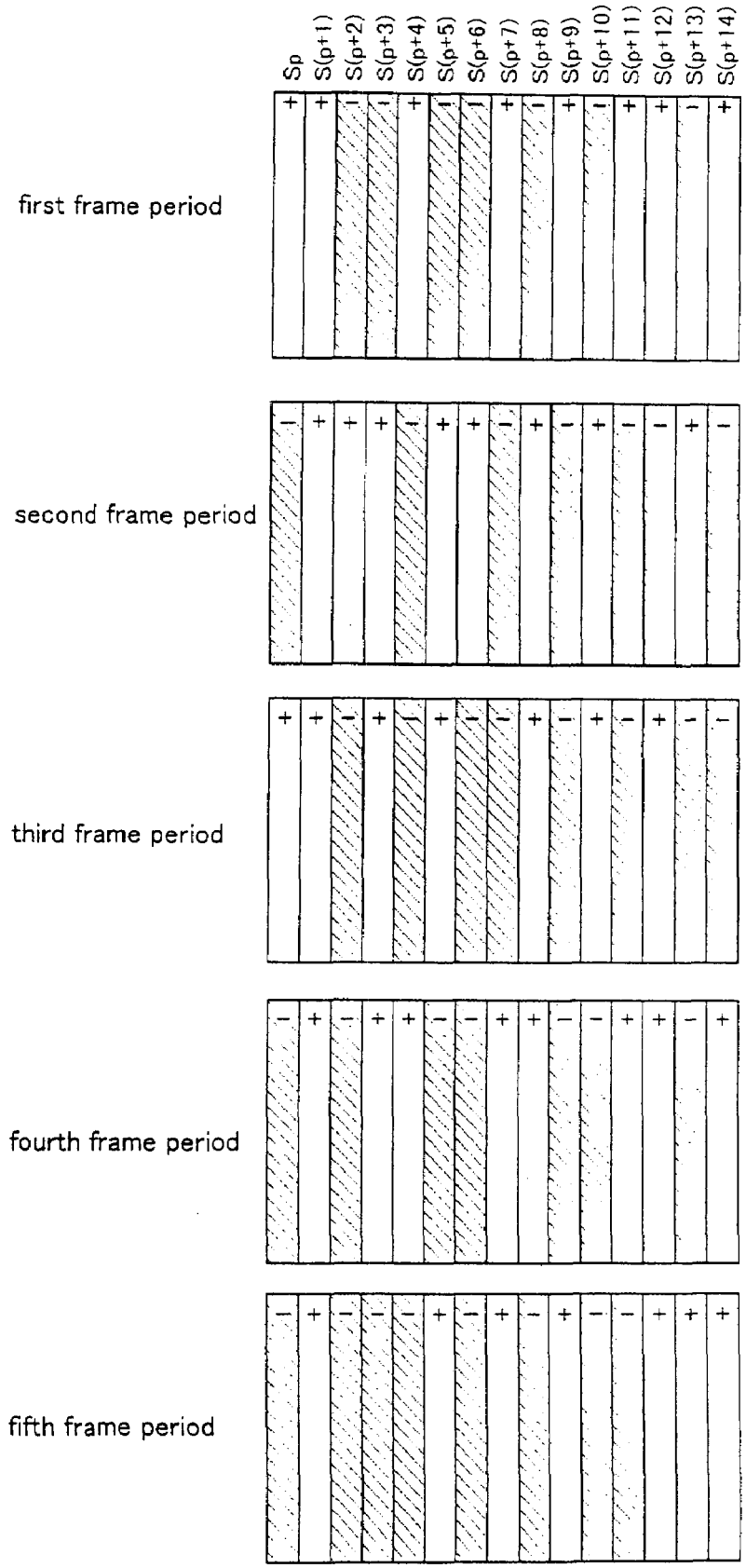
FIG. 2 is a diagram showing a pixel polarity pattern in a driving method of the present invention.
Figure 3:
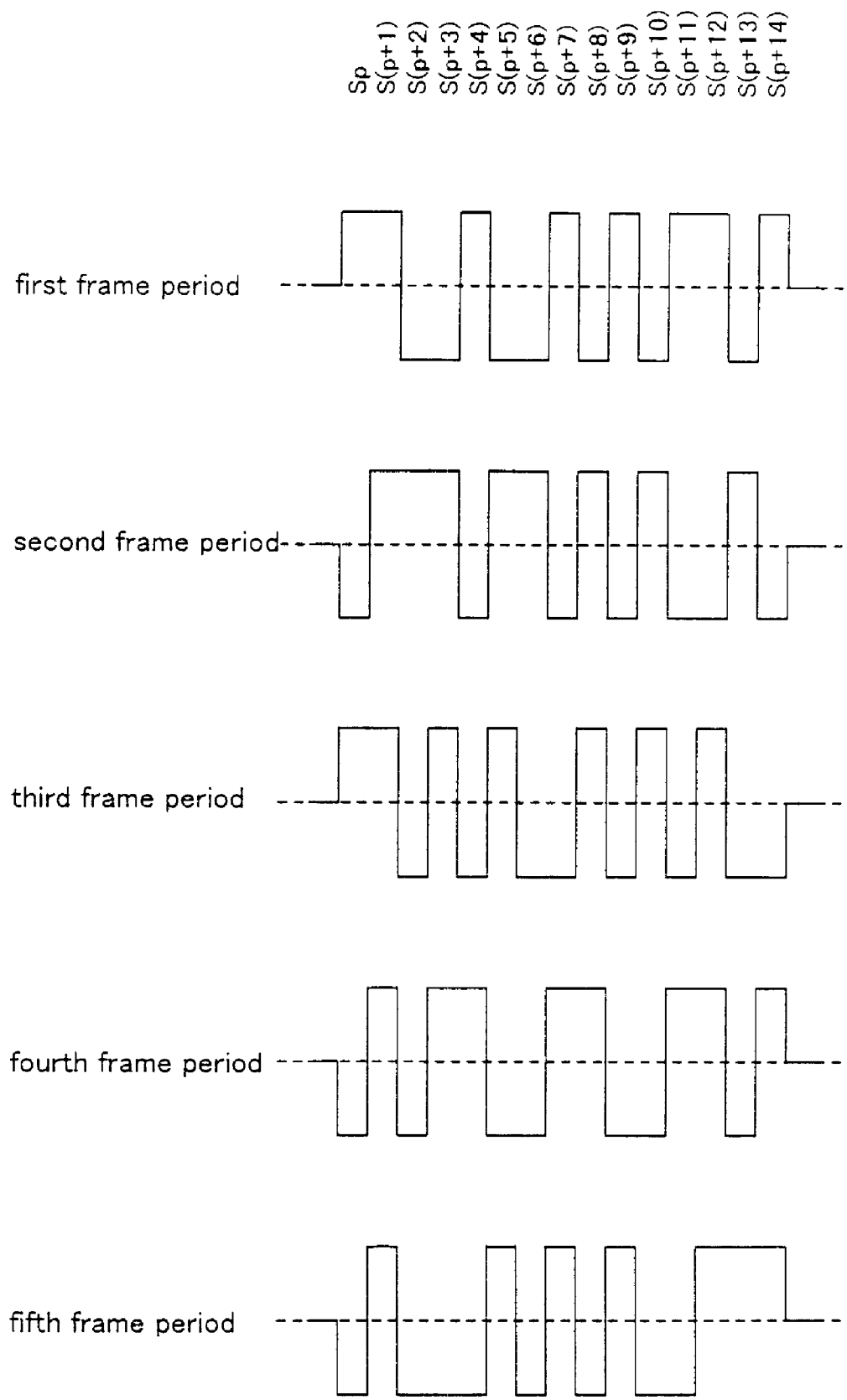
FIG. 3 is a diagram showing the electric potential of a display signal in a driving method of the present invention.

A polarity pattern of each pixel in an alternating current drive of the present invention is shown in FIG. 2. Note that, in order to simplify the explanation, the polarity pattern of only pixels connected to 15 arbitrary adjacent source signal lines Sp, S(p+1), S(p+2), . . . , S(p+14) among the source signal lines S1 to Sx, is shown. Further, the pixels connected to each source signal line are not separated but are shown as one rectangle in Embodiment mode 1. Further, FIG. 3 is a diagram showing the electric potential of display signals inputted to each source line in the alternating current driving of Embodiment mode 1, shown in FIG. 2, in a case in which an active matrix liquid crystal display device performing white display provided it is normally black, and performing black display provided it is normally white.

The polarities of the display signals inputted to the pixels connected to the source signal lines Sp, S(p+1), S(p+2), . . . , S(p+14) become positive, positive, negative, negative, positive, negative, positive, negative, positive, negative, positive, positive, negative, and positive, respectively, in a first frame period. Namely, the display signals of the positive polarity are inputted to the pixels connected to the source signal lines Sp, S(p+1), S(p+4), S(p+7), S(p+9), S(p+11), S(p+12), and S(p+14). Further, the display signals of the negative polarity are inputted to the pixels connected to the source signal lines S(p+2), S(p+3), S(p+5), S(p+6), S(p+8), S(p+10), and S(p+13).

In a second frame period, the polarities of display signals inputted to the pixels connected to the source signal lines Sp, S(p+1), S(p+2), . . . , S(p+14) become negative, positive, positive, positive, negative, positive, positive, negative, positive, negative, positive, negative, negative, positive, and negative, respectively. Namely, the display signals of the positive polarity are inputted to the pixels connected to the source signal lines S(p+1), S(p+2), S(p+3), S(p+5), S(p+6), S(p+8), S(p+10), and S(p+13). Further, the display signals of the negative polarity are inputted to the pixels connected to the source signal lines Sp, S(p+4), S(p+7), S(p+9), S(p+11), S(p+13), and S(p+14).

In a third frame period, the polarities of display signals inputted to the pixels connected to the source signal lines Sp, S(p+1), S(p+2), . . . , S(p+14) become positive, positive, negative, positive, negative, positive, negative, negative, positive, negative, positive, negative, positive, negative, and negative, respectively. Namely, the display signals of the positive polarity are inputted to the pixels connected to the source signal lines Sp, S(p+1), S(p+3), S(p+5), S(p+8), S(p+10), and S(p+12). Further, the display signals of the negative polarity are inputted to the pixels connected to the source signal lines S(p+2), S(p+4), S(p+6), S(p+7), S(p+9), S(p+11), S(p+13), and S(p+14).

In a fourth frame period, the polarities of display signals inputted to the pixels connected to the source signal lines Sp, S(p+1), S(p+2), . . . , S(p+14) become negative, positive, negative, positive, positive, negative, negative, positive, positive, negative, negative, positive, positive, negative, and positive, respectively. Namely, the display signals of the positive polarity are inputted to the pixels connected to the source signal lines S(p+1), S(p+3), S(p+4), S(p+7), S(p+8), S(p+11), S(p+12), and S(p+14). Further, the display signals of the negative polarity are inputted to the pixels connected to the source signal lines Sp, S(p+2), S(p+5), S(p+6), S(p+9), S(p+10), and S(p+13).

In a fifth frame period, the polarities of display signals inputted to the pixels connected to the source signal lines Sp, S(p+1), S(p+2), . . . , S(p+14) become negative, positive, negative, negative, negative, positive, negative, positive, negative, positive, negative, negative, positive, positive, and positive, respectively. Namely, the display signals of the positive polarity are inputted to the pixels connected to the source signal lines S(p+1), S(p+5), S(p+7), S(p+9), S(p+12), S(p+13), and S(p+14). Further, the display signals of the negative polarity are inputted to the pixels connected to the source signal lines Sp, S(p+2), S(p+3), S(p+4), S(p+6), S(p+8), S(p+10), and S(p+11).

Display signals having the same polarity are thus inputted to pixels connected to the same source signal lines in Embodiment mode 1. Pixels to which display signals of the positive polarity are inputted, and pixels to which display signals of the negative polarity are inputted are then randomly changed every frame period.

Note that, although only up to the fifth frame period is explained in Embodiment mode 1, display signals having the same polarity are also inputted to the pixels connected to the same source signal lines during frame periods appearing subsequent to the fifth frame period. Pixels to which display signals of the positive polarity are inputted, and pixels to which display signals of the negative polarity are inputted are then randomly changed every frame period.

In performing alternating current drive, the frequency of the driver circuit can be suppressed, and flicker, vertical striping, and horizontal striping observed on a screen by a viewer can also be suppressed by using the above structure.

Further, degradation of the liquid crystals can be suppressed in accordance with the above structure because the periods during which display signals of the positive polarity are inputted are nearly equal to the periods during which display signals of the negative polarity are inputted, for each pixel.

Embodiment Mode 2

An example of a driving method of the present invention, which is different from that shown in Embodiment mode 1, is explained in Embodiment mode 2.

Figure 4:
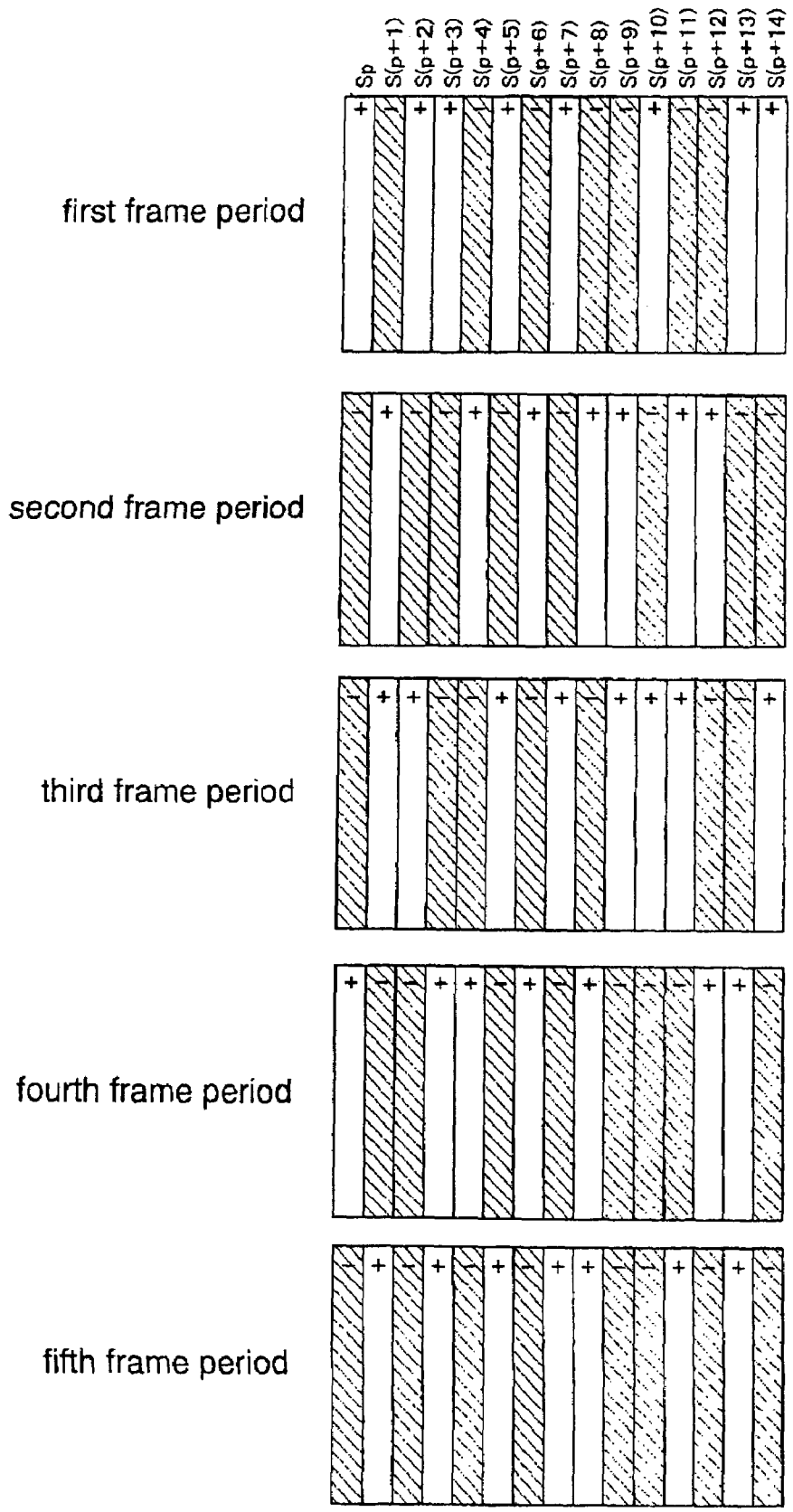
FIG. 4 is a diagram showing a pixel polarity pattern in a driving method of the present invention.

A polarity pattern of each pixel in an alternating current drive of the present invention is shown in FIG. 4. Note that, in order to simplify the explanation, the polarity pattern of only pixels connected to 15 arbitrary and adjacent source signal lines Sp, S(p+1), S(p+2), . . . , S(p+14) among the source signal lines S1 to Sx, is shown. Further, the pixels connected to each source signal line are not separated but are shown as one rectangle in Embodiment mode 2.

The polarities of display signals inputted to the pixels connected to the source signal lines Sp, S(p+1), S(p+2), . . . , S(p+14) become positive, negative, positive, positive, negative, positive, negative, positive, negative, negative, positive, negative, negative, positive, and positive, respectively, in a first frame period. Namely, the display signals of the positive polarity are inputted to the pixels connected to the source signal lines Sp, S(p+2), S(p+3), S(p+5), S(p+7), S(p+10), S(p+13), and S(p+14). Further, the display signals of the negative polarity are inputted to the pixels connected to the source signal lines S(p+1), S(p+4), S(p+6), S(p+8), S(p+9), S(p+11), and S(p+12).

In a second frame period, the polarities of display signals inputted to the pixels connected to the source signal lines Sp, S(p+1), S(p+2), . . . , S(p+14) become negative, positive, negative, negative, positive, negative, positive, negative, positive, positive, negative, positive, positive, negative, and negative, respectively, the inverse of those during the first frame period. Namely, the display signals of the negative polarity are inputted to the pixels connected to the source signal lines S(p+1), S(p+4), S(p+6), S(p+8), S(p+9), S(p+11), and S(p+12). Further, the display signals of the negative polarity are inputted to the pixels connected to the source signal lines Sp, S(p+2), S(p+3), S(p+5), S(p+7), S(p+10), S(p+13), and S(p+14).

In a third frame period, the polarities of display signals inputted to the pixels connected to the source signal lines Sp, S(p+1), S(p+2), . . . , S(p+14) become negative, positive, positive, negative, negative, positive, negative, positive, negative, positive, positive, positive, negative, negative, and positive, respectively. Namely, the display signals of the positive polarity are inputted to the pixels connected to the source signal lines S(p+1), S(p+2), S(p+5), S(p+7), S(p+9), S(p+10), S(p+11), and S(p+14). Further, the display signals of the negative polarity are inputted to the pixels connected to the source signal lines Sp, S(p+3), S(p+4), S(p+6), S(p+8), S(p+12), and S(p+13).

In a fourth frame period, the polarities of display signals inputted to the pixels connected to the source signal lines Sp, S(p+1), S(p+2), . . . , S(p+14) become positive, negative, negative, positive, positive, negative, positive, negative, positive, negative, negative, negative, positive, positive, and negative, respectively, the inverse of those during the third frame period. Namely, the display signals of the positive polarity are inputted to the pixels connected to the source signal lines Sp, S(p+3), S(p+4), S(p+6), S(p+8), S(p+12), and S(p+13). Further, the display signals of the negative polarity are inputted to the pixels connected to the source signal lines S(p+1), S(p+2), S(p+5), S(p+7), S(p+9), S(p+10), S(p+11), and S(p+14).

In a fifth frame period, the polarities of display signals inputted to the pixels connected to the source signal lines Sp, S(p+1), S(p+2), . . . , S(p+14) become negative, positive, negative, positive, negative, positive, negative, positive, positive, negative, negative, positive, negative, positive, and negative, respectively. Namely, the display signals of the positive polarity are inputted to the pixels connected to the source signal lines S(p+1), S(p+3), S(p+5), S(p+7), S(p+8), S(p+11), and S(p+13). Further, the display signals of the negative polarity are inputted to the pixels connected to the source signal lines Sp, S(p+2), S(p+4), S(p+6), S(p+9), S(p+10), S(p+12), and S(p+14).

Note that, although only up to the fifth frame period is explained in Embodiment mode 2, the polarity of the display signals inputted to the pixels connected to the source signal lines Sp, S(p+1), S(p+2), . . . , S(p+14) in a sixth frame period are the inverse of those inputted during the fifth frame period, respectively.

Display signals having the same polarity are thus mutually inputted to pixels connected to the same source signal lines in Embodiment mode 2. Then, from among two adjacent frame periods, the polarities of the display signals inputted to each pixel in the frame period appearing later are the inverse of the polarities of the display signals inputted to each pixel during the frame period appearing earlier. In other words, the polarity patterns of two adjacent frame periods are mutually inverted. In addition, the pixels to which display signals of positive polarity are inputted, and the pixels to which display signals of the negative polarity are inputted are randomly changed every two frame periods.

Further, display signals having the same polarity are also similarly inputted to the pixels connected to the same source signal lines during frame periods appearing subsequent to the sixth frame period. The pixels to which display signals of the positive polarity are inputted, and the pixels to which display signals of the negative polarity are inputted are randomly changed every second frame period. Two adjacent frame periods have mutually inverted polarity patterns.

In performing alternating current drive, the frequency of the driver circuit can be suppressed, and flicker, vertical striping, and horizontal striping observed on a screen by a viewer can also be suppressed by using the above structure.

Further, degradation of the liquid crystals can be suppressed in accordance with the above structure because the periods during which display signals of the positive polarity are inputted are nearly equal to the periods during which display signals of the negative polarity are inputted, for each pixel.

Embodiment Mode 3

An example of a driving method of the present invention, which is different from that shown in Embodiment modes 1 and 2, is explained in Embodiment mode 3.

Figure 5:
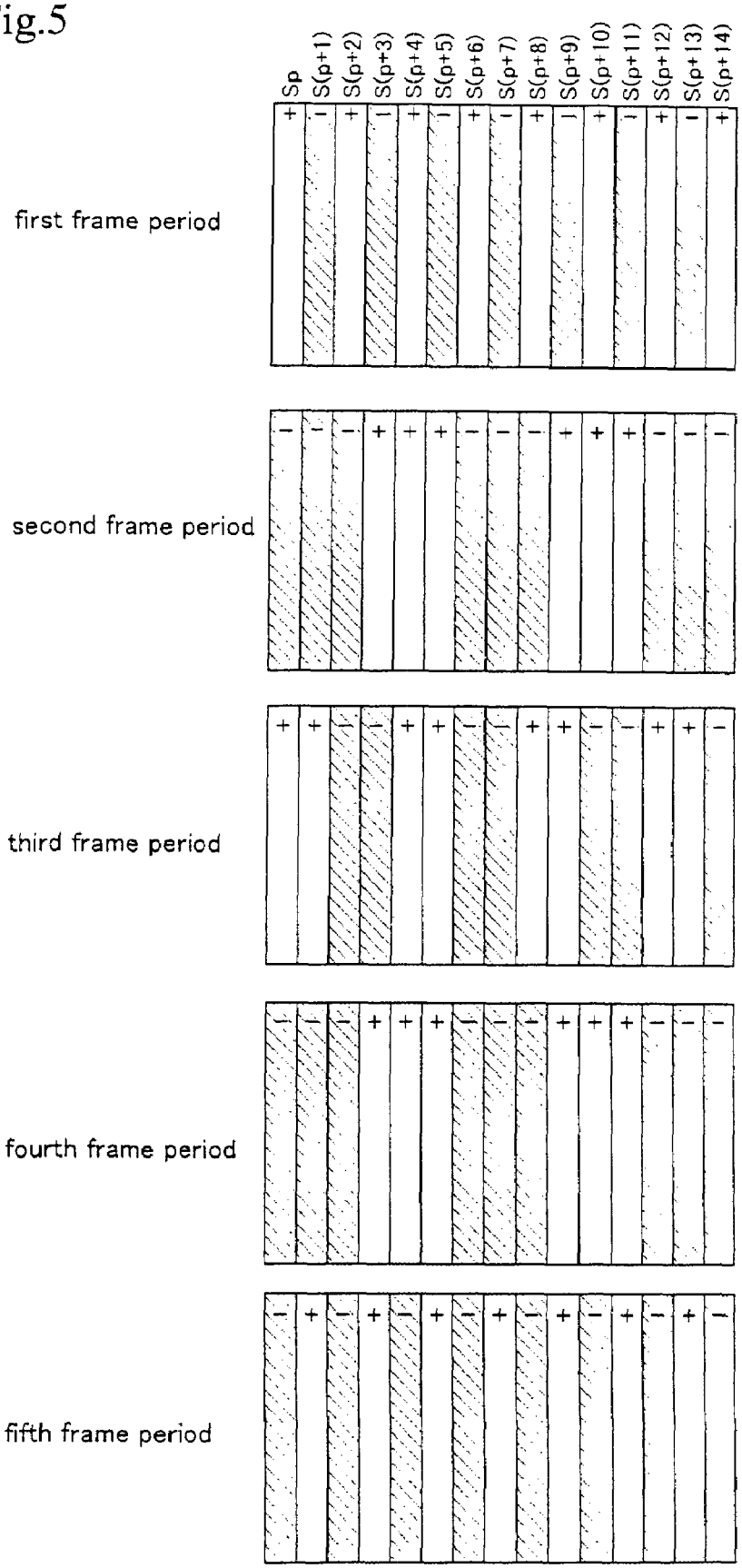
FIG. 5 is a diagram showing a pixel polarity pattern in a driving method of the present invention.

A polarity pattern of each pixel in an alternating current drive of the present invention is shown in FIG. 5. Note that, in order to simplify the explanation, the polarity pattern of only pixels connected to 15 arbitrary and adjacent source signal lines Sp, S(p+1), S(p+2), . . . , S(p+14) among the source signal lines S1 to Sx, is shown. Further, the pixels connected to each source signal line are not separated but are shown as one rectangle in Embodiment mode 3.

The polarities of display signals inputted to the pixels connected to the source signal lines Sp, S(p+1), S(p+2), . . . , S(p+14) in a first frame period become positive, negative, positive, negative, positive, negative, positive, negative, positive, negative, positive, negative, positive, negative, and positive, respectively, inverted every source signal line. Namely, the display signals of the positive polarity are inputted to the pixels connected to the source signal lines Sp, S(p+2), S(p+4), S(p+6), S(p+8), S(p+10), S(p+12), and S(p+14). Further, the display signals of the negative polarity are inputted to the pixels connected to the source signal lines S(p+1), S(p+3), S(p+5), S(p+7), S(p+9), S(p+11), and S(p+13).

In a second frame period, the polarities of display signals inputted to the pixels connected to the source signal lines Sp, S(p+1), S(p+2), . . . , S(p+14) become negative, negative, negative, positive, positive, positive, negative, negative, negative, positive, positive, positive, negative, negative, and negative, respectively, inverted every third source signal line. Namely, the display signals of the positive polarity are inputted to the pixels connected to the source signal lines S(p+3), S(p+4), S(p+5), S(p+9), S(p+10), and S(p+11). Further, the display signals of the negative polarity are inputted to the pixels connected to the source signal lines Sp, S(p+1), S(p+2), S(p+6), S(p+7), S(p+8), S(p+12), S(p+13), and S(p+14).

In a third frame period, the polarities of display signals inputted to the pixels connected to the source signal lines Sp, S(p+1), S(p+2), ..., S(p+14) become positive, positive, negative, negative, positive, positive, negative, negative, positive, positive, negative, negative, positive, positive, and negative, respectively, inverted every second source signal line. Namely, the display signals of positive polarity are inputted to the pixels connected to the source signal lines Sp, S(p+1), S(p+4), S(p+5), S(p+8), S(p+9), S(p+12), and S(p+13). Further, the display signals of the negative polarity are inputted to the pixels connected to the source signal lines S(p+2), S(p+3), S(p+6), S(p+7), S(p+10), S(p+11), and S(p+14).

In a fourth frame period, the polarities of display signals inputted to the pixels connected to the source signal lines Sp, S(p+1), S(p+2), ..., S(p+14) become negative, negative, negative, positive, positive, positive, negative, negative, negative, positive, positive, positive, negative, negative, and negative, respectively, inverted every third source signal line. Namely, the display signals of the positive polarity are inputted to the pixels connected to the source signal lines S(p+3), S(p+4), S(p+5), S(p+9), S(p+10), and S(p+11). Further, the display signals of the negative polarity are inputted to the pixels connected to the source signal lines Sp, S(p+1), S(p+2), S(p+6), S(p+7), S(p+8), S(p+12), S(p+13), and S(p+14).

In a fifth frame period, the polarities of display signals inputted to the pixels connected to the source signal lines Sp, S(p+1), S(p+2), ..., S(p+14) become negative, positive, negative, positive, negative, positive, negative, positive, negative, positive, negative, positive, negative, positive, and negative, respectively, inverted every source signal line. Namely, the display signals of the positive polarity are inputted to the pixels connected to the source signal lines S(p+1), S(p+3), S(p+5), S(p+7), S(p+9), S(p+11), and S(p+13). Further, the display signals of the negative polarity are inputted to the pixels connected to the source signal lines Sp, S(p+2), S(p+4), S(p+6), S(p+8), S(p+10), S(p+12), and S(p+14).

Display signals having the same polarity are thus inputted to pixels connected to the same source signal lines with Embodiment mode 3. The display signals having the same polarity are inputted to an arbitrary number of adjacent source signal lines in each frame period, and as a result, the display signals having the same polarity are inputted to the pixels connected to the adjacent source signal lines. In addition, the pixels to which display signals of the positive polarity are inputted, and the pixels to which display signals of the negative polarity are inputted are randomly changed every frame period.

Note that the source signal lines to which display signals having the same polarity are inputted exist as groups of 1, 2, or 3 in Embodiment mode 3. However, the present invention is not limited to this. Provided that flicker, vertical striping, and horizontal striping can be made more difficult to observe on a screen by a viewer when compared to a conventional example, and provided that the periods during which display signals of the positive polarity are inputted are nearly equal to the periods during which display signals of the negative polarity are inputted for each pixel, then the present invention is not limited to the above stated numbers.

Note that, although only up to the fifth frame period is explained in Embodiment mode 3, display signals having the same polarity are also inputted mutually to the pixels connected to the same source signal lines during frame periods appearing subsequent to the fifth frame period. Display signals having the same polarity are inputted to an arbitrary number of adjacent source signal lines in each of the frame periods, and as a result, display signals having the same polarity are inputted to the pixels connected to the adjacent source signal lines. In addition, pixels to which display signals of the positive polarity are inputted, and pixels to which display signals of the negative polarity are inputted are then randomly changed every frame period.

In performing alternating current drive, the frequency of the driver circuit can be suppressed, and flicker, vertical striping, and horizontal striping observed on a screen by a viewer can also be suppressed by using the above structure.

Further, degradation of the liquid crystals can be suppressed in accordance with the above structure because the periods during which display signals of the positive polarity are inputted are nearly equal to the periods during which display signals of the negative polarity are inputted for each pixel.

Embodiment Mode 4

An example of a driving method of the present invention, which is different from that shown in Embodiment modes 1 to 3, is explained in Embodiment mode 4.

Figure 6:
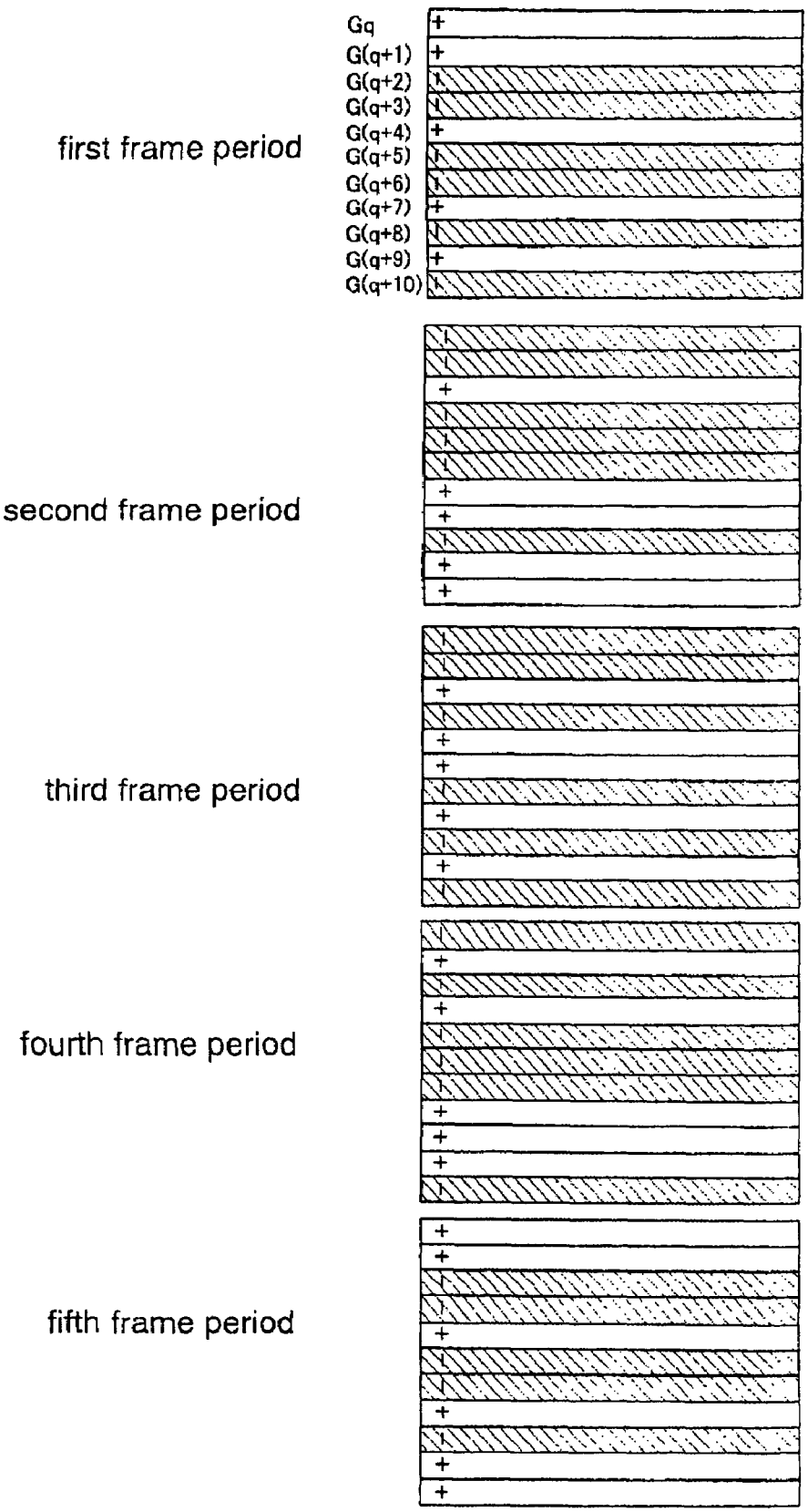
FIG. 6 is a diagram showing a pixel polarity pattern in a driving method of the present invention.

A polarity pattern of each pixel in an alternating current drive of the present invention is shown in FIG. 6. Note that, in order to simplify the explanation, the polarity pattern of only pixels connected to 11 arbitrary and adjacent gate signal lines Gq, G(q+1), G(q+2), ..., G(q+10) among the gate signal lines G1 to Gy, is shown. Further, the pixels connected to each gate signal line are not separated but are shown as one rectangle in Embodiment mode 4.

The polarities of display signals inputted to the pixels connected to the gate signal lines Gq, G(q+1), G(q+2), ..., G(q+10) become positive, positive, negative, negative, positive, negative, negative, positive, negative, positive, and negative, respectively, in a first frame period. Namely, the display signals of the positive polarity are inputted to the pixels connected to the gate signal lines Gq, G(q+1), G(q+4), G(q+7), and G(q+9). Further, the display signals of the negative polarity are inputted to the pixels connected to the gate signal lines G(q+2), G(q+3), G(q+5), G(q+6), G(q+8), and G(q+10).

In a second frame period, the polarities of display signals inputted to the pixels connected to the gate signal lines Gq, G(q+1), G(q+2), ..., G(q+10) become negative, negative, positive, negative, negative, negative, positive, positive, negative, positive, and positive, respectively. Namely, the display signals of the positive polarity are inputted to the pixels connected to the gate signal lines G(q+2), G(q+6), G(q+7), G(q+9), and G(q+10). Further, the display signals of the negative polarity are inputted to the pixels connected to the gate signal lines Gq, G(q+1), G(q+3). G(q+4), G(q+5), and G(q+8).

In a third frame period, the polarities of display signals inputted to the pixels connected to the gate signal lines Gq, G(q+1), G(q+2), ..., G(q+10) become negative, negative, positive, negative, positive, positive, negative, positive, negative, positive, and negative, respectively. Namely, the display signals of the positive polarity are inputted to the pixels connected to the gate signal lines G(q+2), G(q+4), G(q+5), G(q+7), and G(q+9). Further, the display signals of the negative polarity are inputted to the pixels connected to the gate signal lines Gq, G(q+1), G(q+3), G(q+6), G(q+8), and G(q+10).

In a fourth frame period, the polarities of display signals inputted to the pixels connected to the gate signal lines Gq, G(q+1), G(q+2), ..., G(q+10) become negative, positive, negative, positive, negative, negative, negative, positive, positive, positive, and negative, respectively. Namely, the display signals of the positive polarity are inputted to the pixels connected to the gate signal lines G(q+1), G(q+3), G(q+7), G(q+8), and G(q+9). Further, the display signals of the negative polarity are inputted to the pixels connected to the gate signal lines Gq, G(q+2), G(q+4), G(q+5), G(q+6), and G(q+10).

In a fifth frame period, the polarities of display signals inputted to the pixels connected to the gate signal lines Gq, G(q+1), G(q+2), . . . , G(q+10) become positive, positive, negative, negative, positive, negative, negative, positive, negative, positive, and positive, respectively. Namely, the display signals of the positive polarity are inputted to the pixels connected to the gate signal lines Gq, G(q+1), G(q+4), G(q+7), G(q+9), and G(q+10). Further, the display signals of the negative polarity are inputted to the pixels connected to the gate signal lines G(q+2), G(q+3), G(q+5), G(q+6), and G(q+8).

Display signals having the same polarity are thus inputted to pixels connected to the same gate signal lines with Embodiment mode 4 Pixels to which display signals of the positive polarity are inputted, and pixels to which display signals of the negative polarity are inputted are then randomly changed every frame period.

Note that, although only up to the fifth frame period is explained in Embodiment mode 4, display signals having the same polarity are also inputted to the pixels connected to the same gate signal lines during frame periods appearing subsequent to the fifth frame period. Pixels to which display signals of the positive polarity are inputted, and pixels to which display signals of the negative polarity are inputted are then randomly changed every frame period.

In performing alternating current drive, the frequency of the driver circuit can be suppressed, and flicker, vertical striping, and horizontal striping observed on a screen by a viewer can also be suppressed by using the above structure.

Further, degradation of the liquid crystals can be suppressed in accordance with the above structure because the periods during which display signals of the positive polarity are inputted are nearly equal to the periods during which display signals of the negative polarity are inputted for each pixel.

Embodiment Mode 5

An example of a driving method of the present invention, which is different from that shown in Embodiment modes 1 to 4, is explained in Embodiment mode 5.

Although a polarity pattern is not shown in a figure for Embodiment mode 5, display signals having the same polarity are mutually inputted to pixels connected to the same gate signal lines. Then, from among two adjacent frame periods, the polarities of the display signals inputted to each pixel in the frame period appearing later are the inverse of the polarities of the display signals inputted to each pixel during the frame period appearing earlier. In other words, the polarity patterns of two adjacent frame periods are mutually inverted. In addition, the pixels to which display signals of the positive polarity are inputted, and the pixels to which display signals of the negative polarity are inputted are randomly changed every two frame periods.

In performing alternating current drive, the frequency of the driver circuit can be suppressed, and flicker, vertical striping, and horizontal striping observed on a screen by a viewer can also be suppressed by using the above structure.

Further, degradation of the liquid crystals can be suppressed in accordance with the above structure because the periods during which display signals of the positive polarity are inputted are nearly equal to the periods during which display signals of the negative polarity are inputted for each pixel.

Embodiment Mode 6

An example of a driving method of the present invention, which is different from that shown in Embodiment modes 1 to 5, is explained in Embodiment mode 6.

Although a polarity pattern is not shown in a figure for Embodiment mode 6, display signals having the same polarity are mutually inputted to pixels connected to the same gate signal lines. Gate signal lines connected to the pixels to which display signals having the same polarity are inputted, may exist as groups of arbitrary number in every frame period. Provided that flicker, vertical striping, and horizontal striping can be made more difficult to observe on a screen by a viewer when compared to a conventional example, and provided that the periods when display signals of the positive polarity are inputted are nearly equal to the periods when display signals of the negative polarity are inputted, then the arbitrary number may have any value.

Further, pixels to which display signals of the positive polarity are inputted, and pixels to which display signals of the negative polarity are inputted are then randomly changed every frame period.

In performing alternating current drive, the frequency of the driver circuit can be suppressed, and flicker, vertical striping, and horizontal striping observed on a screen by a viewer can also be suppressed by using the above structure.

Further, degradation of the liquid crystals can be suppressed in accordance with the above structure because the periods during which display signals of the positive polarity are inputted are nearly equal to the periods during which display signals of the negative polarity are inputted for each pixel.

Embodiment Mode 7

An example of a driving method of the present invention, which is different from that shown in Embodiment modes 1 to 6, is explained in Embodiment mode 7.

A polarity pattern of each pixel in an alternating current drive of the present invention is shown in FIG. 7. Note that, in order to simplify the explanation, the polarity pattern of only pixels connected to 13 adjacent source signal lines Sp, S(p+1), S(p+2), . . . , S(p+12) among the source signal lines S1 to Sx, and to 11 adjacent gate signal lines Gq, G(q+1), G(q+2), . . . , G(q+10) among the gate signal lines G1 to Gy, is shown.

As shown in FIG. 7, positions at which pixels having display signals of the positive polarity inputted exist, and positions at which pixels having digital signals of the negative polarity inputted exist, differ every frame period.

Note that, although the positions at which pixels having the display signals of positive or negative polarity inputted exist are random every frame period, the present invention is not limited to this. Provided that flicker, vertical striping, and horizontal striping can be made more difficult to observe on a screen by a viewer when compared to a conventional example, and provided that, degradation of the liquid crystals can be suppressed, then the positions may also have regularity.

In performing alternating current drive, the frequency of the driver circuit can be suppressed, and flicker, vertical striping, and horizontal striping observed on a screen by a viewer can be suppressed by using the above structure.

Further, degradation of the liquid crystals can be suppressed in accordance with the above structure because the periods during which display signals of the positive polarity are inputted are nearly equal to the periods during which display signals of the negative polarity are inputted for each pixel.

Note that, although cases of arranging pixels in stripe shapes have been explained in Embodiment modes 1 to 7, the present invention is not limited to these. It is also possible to apply the present invention to pixels in a delta arrangement, not only the pixels in stripe shapes. Note also delta arrangement refers a pixel arrangement in which an interior angle of a triangular shape formed by the center of three arbitrary adjacent pixels does not become a right angle.

In addition, although cases of alternating current drive of liquid crystal display devices are explained in the embodiment modes, the present invention is not limited to these. It is sufficiently possible to apply the driving method of the present invention to electronic displays except liquid crystal panels, for example to an EL display devices, also called a light emitting devices or a light emitting diodes. The EL devices referred to in this specification include triplet-based light emission device and singlet-based light emission devices, for example. The deterioration speed of EL materials of the EL display device can be suppressed in accordance with alternating current drive of the EL display device.

Embodiments of the present invention are explained below.

Embodiment 1

Figure 8:
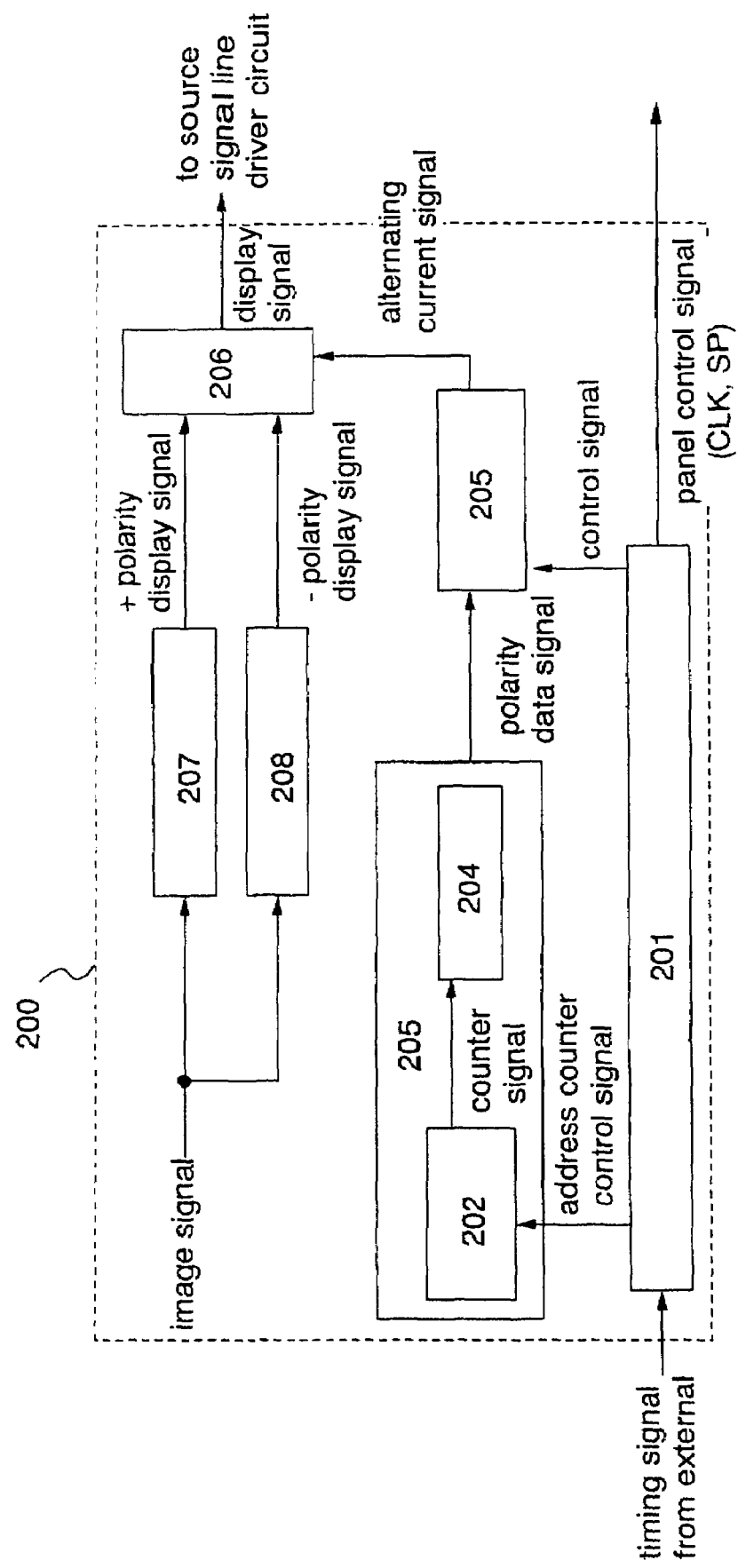
FIG. 8 is a block diagram of a display signal generation portion for generating a display signal of a semiconductor display device of the present invention.

A display signal generation portion for generating a display signal in a semiconductor display device of the present invention is explained in Embodiment 1 using FIG. 8. Note that an example of a semiconductor display device driven by an analog method is explained in Embodiment 1.

A display signal generation portion 200 has a control portion 201, a polarity data signal generation portion 203, an alternating current signal generation portion 205, a display signal selection portion 206, a + side display signal generation portion 207, and a − side display signal generation portion 208.

Panel control signals, address counter control signals, and control signals are generated in the control signal portion 201 in accordance with a timing signal inputted to the control portion 201 from external of the control portion 201. The panel control signals are signals such as a clock signal CLK and a start pulse signal SP, which are inputted to a source signal line driver circuit and to a gate signal line driver circuit.

The address counter control signals and the control signals are inputted to the polarity data signal generation portion 203 and to the alternating current signal generation portion 205, respectively, from the control portion 201.

The polarity data signal generation portion 203 is a portion for generating polarity data signals. The polarity data signals have information (polarity data) regarding the polarity of display signals inputted to all of the pixels.

An address counter 202 and a memory 204 are provided in the polarity data signal generation portion 203 in Embodiment 1. Note, however, that Embodiment 1 is not limited to this structure. The polarity data signal generation portion may have any type of structure, provided that it can generate polarity signals having information (polarity data) regarding the polarity of the display signals inputted to all of the pixels.

The address counter control signals inputted to the polarity data signal generation portion 203 are inputted to the address counter 202. The address counter 202 is driven by the inputted address counter control signal and generates counter signals.

The counter signals have counter value as information for specifying addresses of the memory 204. Information (polarity data) regarding the polarity of the display signals inputted to all of the pixels is stored in the memory 204 is m types. The m types of polarity data are stored in the memory 204 from address 0 to address (m−1). The address of the memory 204 is specified by the counter value of the generated counter signal. For example, when the counter value is 0, address 0 of the memory circuit 204 is specified, when the counter value is 1, address 1 is specified, and when the counter value is 2, address 2 is specified. A counter value of (m−1) specifies address (m−1).

Note that when the values from 0 to (m−1) are taken as the counter value, values from 0 to (m−1) are again used. In other words, once the addresses from 0 to (m−1) of the memory circuit 204 are all specified, specification begins again from the address 0 to the address (m−1). There is no particular order in which the counter values are taken, and values may be taken in order from 0 to (m−1), and they may also be taken randomly.

The number m of polarity data is greater than 2, and may be any value provided that flicker, vertical striping, and horizontal striping observed on a screen by a viewer can be suppressed when compared to that of a conventional example. The greater the number m of polarity data, the more that flicker, vertical striping, and horizontal striping observed on a screen by a viewer can be suppressed.

When the polarity data stored in the addresses of the memory 204 is specified by the counter signal, a polarity data signal having the polarity data as information is generated in the polarity data signal portion 203. The generated polarity data signal is inputted to the alternating current signal generation portion 205.

The alternating current signal generation portion 205 is driven by a control signal inputted from the control portion 201, and generates an alternating current signal from the input polarity data signal. The alternating current signal has information on the polarity of the display signals inputted to each pixel, and its waveform is an alternating current waveform. The generated alternating current signal is inputted to the display signal selection portion 206.

On the other hand, image signals are inputted to the + side display signal generation portion 207 and to the − side display signal generation portion 208 from external of the + side display signal generation portion 207 and to the − side display signal generation portion 208. The inputted image signals have portions in which the polarity is inverted and converted into image signals always having the positive polarity (plus image signal) in the + side display signal generation portion 207. Further, the inputted image signals have portions in which the polarity is inverted and converted into image signals always having negative polarity (minus image signal) in the − side display signal generation portion 208.

The plus image signals and the minus image signals are each inputted to the display signal selection portion 206.

The plus image signals or the minus image signals are selected and sampled in accordance with the polarity of the alternating current signal inputted to the display signal selection portion 206. For example, when the polarity of the alternating current signal is positive, the plus image signals are sampled, while the minus image signals are sampled when the polarity of the alternating current signal is negative. The plus image signals and the minus image signals are sampled, and inputted to the source signal line driver circuit as display signals.

An example in which the plus image signals are sampled when the alternating current signal polarity is positive, and in which the minus image signals are sampled when the polarity of the alternating current signal is negative is shown in Embodiment 1, but the present invention is not limited to this. A structure in which the minus image signals are sampled when the alternating current signal polarity is positive, and in which the plus image signals are sampled when the polarity of the alternating current signal is negative may also be used.

The display signals inputted to the source signal line driver circuit is sampled in the source signal line driver circuit, and then inputted to each source signal line.

A driving method of the present invention as shown in the embodiment modes is realized in accordance with the above structure.

Note that the display signal generation portion 200, shown in FIG. 8 in order to form a display signal is formed on an IC chip (a semiconductor circuit structured by MOSFETs formed on single crystal silicon) as an external circuit. The display signal generation portion 200 is then connected to the source signal line driver circuit and to the gate signal line driver circuit formed on the active matrix substrate through an FPC (flexible printed circuit). The present invention is not limited to the above stated structure, however, and a structure in which the source signal line driver circuit is also formed on an IC chip with the display signal generation portion may also be used. Furthermore, a portion of, or the entire display signal generation portion may also be formed on the active matrix substrate.

Embodiment 2

Figure 9:
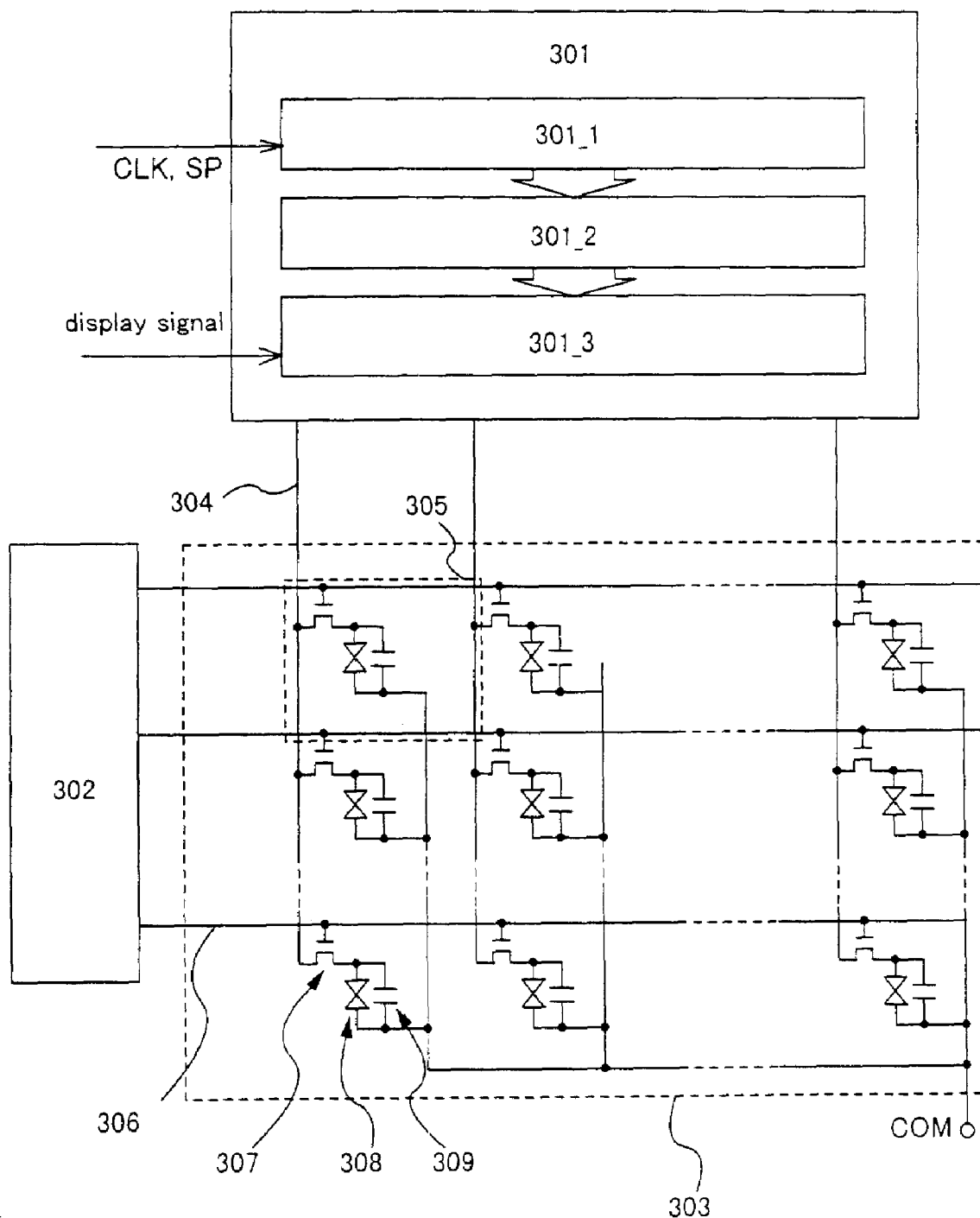
FIG. 9 is a top surface diagram of a semiconductor display device of the present invention.

A semiconductor display device of the present invention driven by an analog method is explained in Embodiment 2. An example of a semiconductor display device of the present invention driven by an analog method is shown in FIG. 9 as a block diagram.

Reference numeral 301 denotes a source signal line driver circuit, reference numeral 302 denotes a gate signal line driver circuit, and reference numeral 303 denotes a pixel portion. One source signal line driver circuit and one gate signal line driver circuit are formed in Embodiment 2, but the present invention is not limited to this structure. Two source signal line driver circuits may also be formed, and two gate signal line driver circuits may also be formed.

The source signal line driver circuit 301 has a shift register 301_1, a level shift 301_2, and a sampling circuit 301_3. Note that the level shift 301_2 may be used when necessary, and need not be used. Further, the level shift 301_2 is provided between the shift resister 301_1 and the sampling circuit 301_3 in Embodiment 2, but the present invention is not limited to this structure. A structure in which the level shift 301_2 is contained within the shift register 301_1 may also be used.

A plurality of source signal lines 304 connected to the source signal line driver circuit 301, and a plurality of gate signal lines 306 connected to the gate signal line driver circuit 302 intersect in the pixel portion 303. A thin film transistor (pixel TFT) 307 of a pixel 305, a liquid crystal cell 308 in which liquid crystal is sandwiched between an opposing electrode and the pixel electrode, and a storage capacitor 309 are formed in a region surrounded by one source signal line 304 and by one gate signal line 306. Note that a structure in which the storage capacitor 309 is formed is shown in Embodiment 2, but it is not always necessary to form the storage capacitor 309.

Further, the gate signal line driver circuit 302 has a shift register and a buffer (neither shown in the figure). The gate signal line driver circuit 302 may also have a level shift.

A clock signal CLK and a start pulse signal SP, which are panel control signals, are inputted to the shift register 301_1. A sampling signal in order to sample the display signal is outputted from the shift register 301_1. The outputted sampling signal is inputted to the level shift 301_2, the amplitude the its electric potential is increased, and it is outputted.

The sampling signal outputted from the level shift 301_2 is inputted to the sampling circuit 301_3. The display signal is inputted to the sampling circuit 301_3 at the same time through a display signal line.

The inputted display signal is sampled in the sampling circuit 301_3 in accordance with the sampling signal, and is inputted to the source signal line 304.

The pixel TFTs 307 are placed in an on state by a selection signal inputted from the gate signal line driver circuit 302 through the gate signal line 306. The display signal which have been sampled and inputted to the source signal line 304 is inputted to the pixel electrode or predetermined pixel 305 through the pixel TFT 307 which are in an on state.

The liquid crystal is driven by the electric potential of the inputted display signal, the amount of light transmitted is controlled, and a portion of the image is displayed in the pixel 305 (the image corresponding to each pixel).

It is possible to freely combine the constitution of Embodiment 2 with the constitution of Embodiment 1.

Embodiment 3

A detailed circuit structure of the source signal line driver circuit shown in Embodiment 2 is explained in Embodiment 3. Note that the source signal line driver circuit shown in Embodiment 2 is not limited by the structure shown in Embodiment 3.

Figure 10:
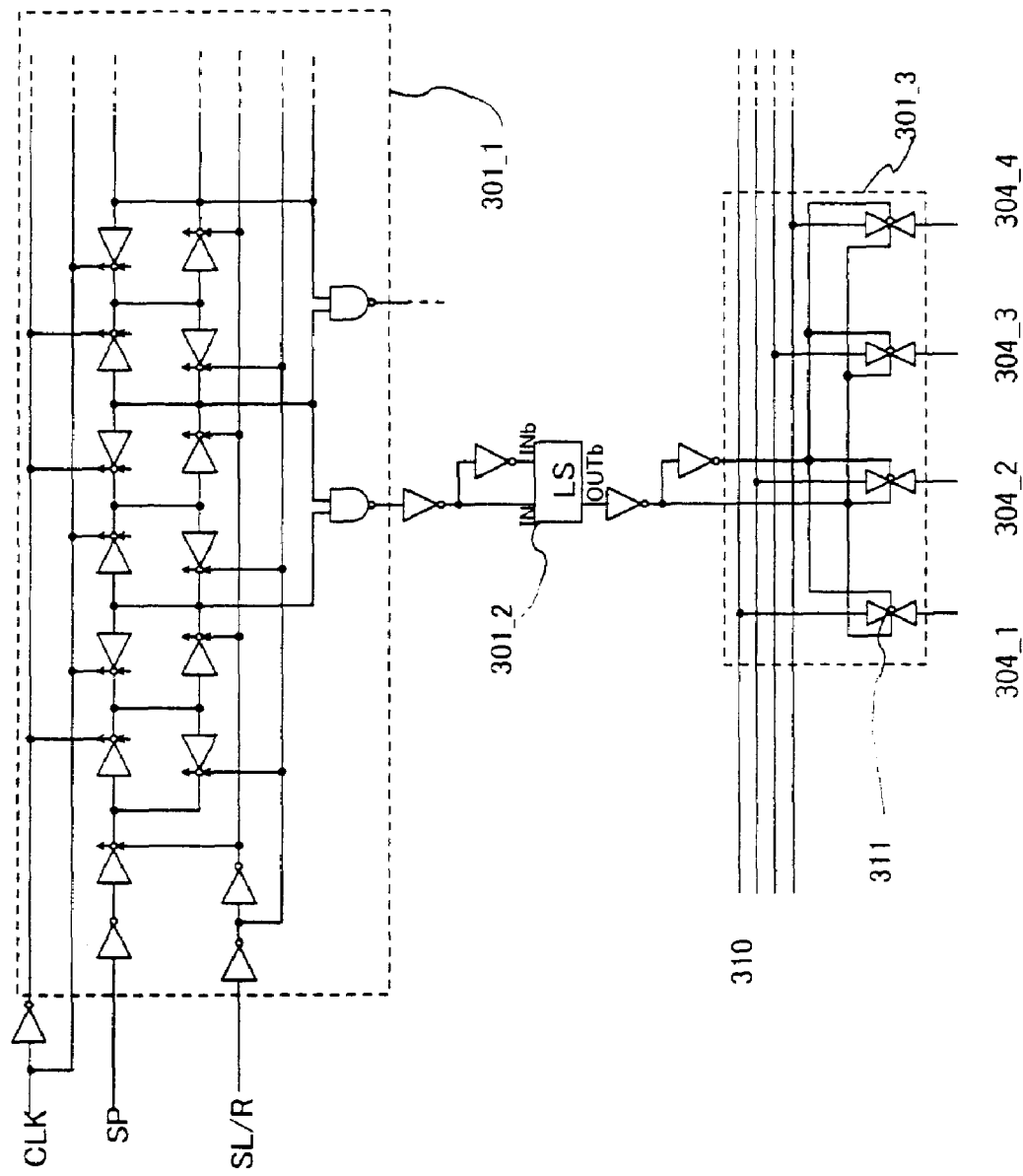
FIG. 10 is a circuit diagram of a source signal line driver circuit.

A circuit diagram of a source signal line driver circuit of Embodiment 3 is shown in FIG. 10. Reference numeral 301_1 denotes the shift register, reference numeral 301_2 denotes the level shift, and reference numeral 301_3 denotes the sampling circuit.

The clock signal CLK, the start pulse signal SP, and a driver direction switch-over signal SL/R signal are inputted to the shift register 301_1 from wirings shown in the figure, respectively. The display signals are inputted to the sampling circuit 301_3 through display signal lines 310. An example of a case of divided driving by four divisions is shown in Embodiment 3, and therefore four of the display signal lines 310 exist. However, the present embodiment is not limited to this structure, and the number of divisions can be arbitrarily determined.

The display signals inputted to each of the display signal lines 310 are sampled in the sampling circuit 301_3 in accordance with sampling signals inputted from the level shift 301_2. Specifically, the display signals are sampled in analog switches 311 in the sampling circuits 301_3, and simultaneously inputted to corresponding source signal lines 304_1 to 304_4, respectively.

The display signals are inputted to all of the source signal lines by repeating the above operations.

Figure 11A:
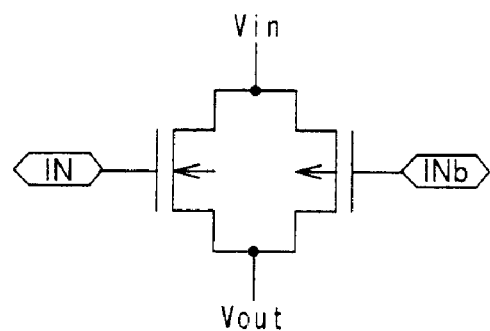
FIGS. 11A and 11B are equivalent circuit diagrams of an analog switch and a level shift, respectively.

An equivalent circuit diagram of the analog switches 311 is shown in FIG. 11A. The analog switches 311 have an n-channel TFT and a p-channel TFT. The display signals are inputted to Vin from the wiring shown in the figure. The sampling signal outputted from the level shift 301_2, and a signal having a polarity which is the inverse of the that of the sampling signal, are then inputted from IN and INb, respectively. The display signals are sampled in accordance with the sampling signal, and the sampled display signals are outputted from Vout of the analog switches.

Figure 11B:
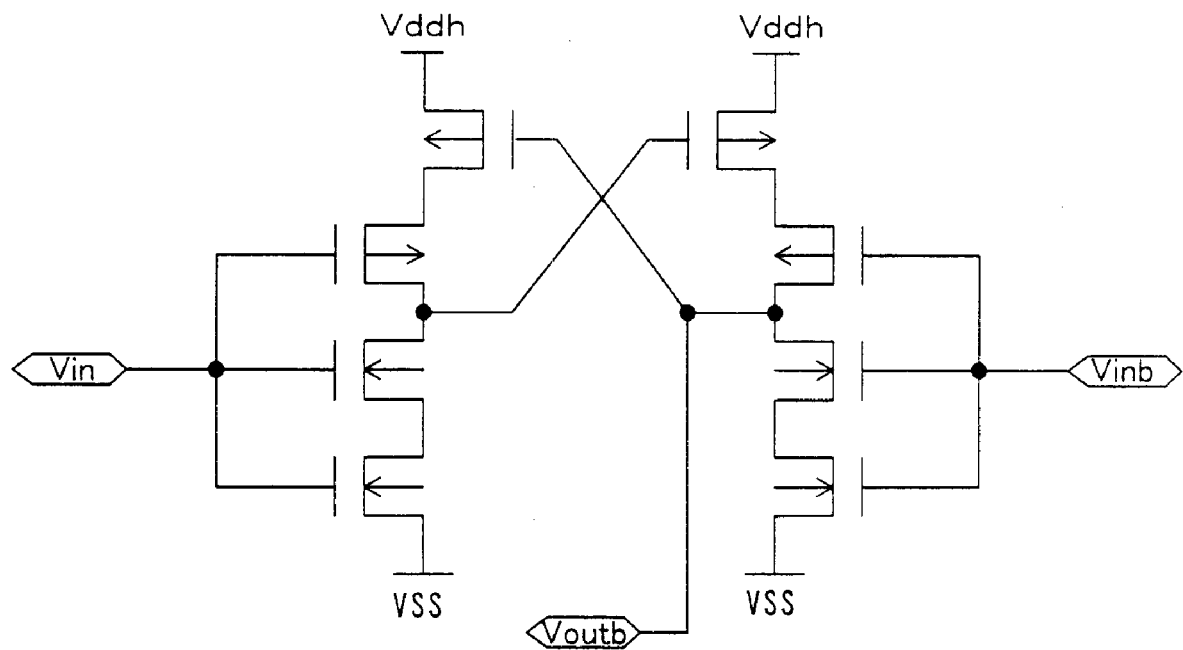

An equivalent circuit diagram of the level shift 301_2 is shown in FIG. 11B. The sampling signal outputted from the shift register 301_1 and the signal having a polarity which is the inverse of that of the sampling signal are inputted from Vin and Vinb, respectively. Further, reference symbol Vddh denotes application of a plus voltage, and reference symbol Vss denotes application of a minus voltage. The level shift 301_2 is designed to make the signal inputted to Vin into a high voltage, inverted signal, and to output that signal from Voutb. In other words, if HI is inputted to Vin, a signal corresponding to Vss is outputted from Voutb, and if LO is inputted to Vin, a signal corresponding to Vddh is outputted from Vout.

Note that the analog switch and the level shift are not limited to the structures shown in FIGS. 11A and 11B, respectively.

Further, it is possible to implement the constitution of Embodiment 3 by freely combining it with the constitution of Embodiment 1 or embodiment 2.

Embodiment 4

A semiconductor display device of the present invention driven by a digital method is explained in Embodiment 4.

Figure 12:
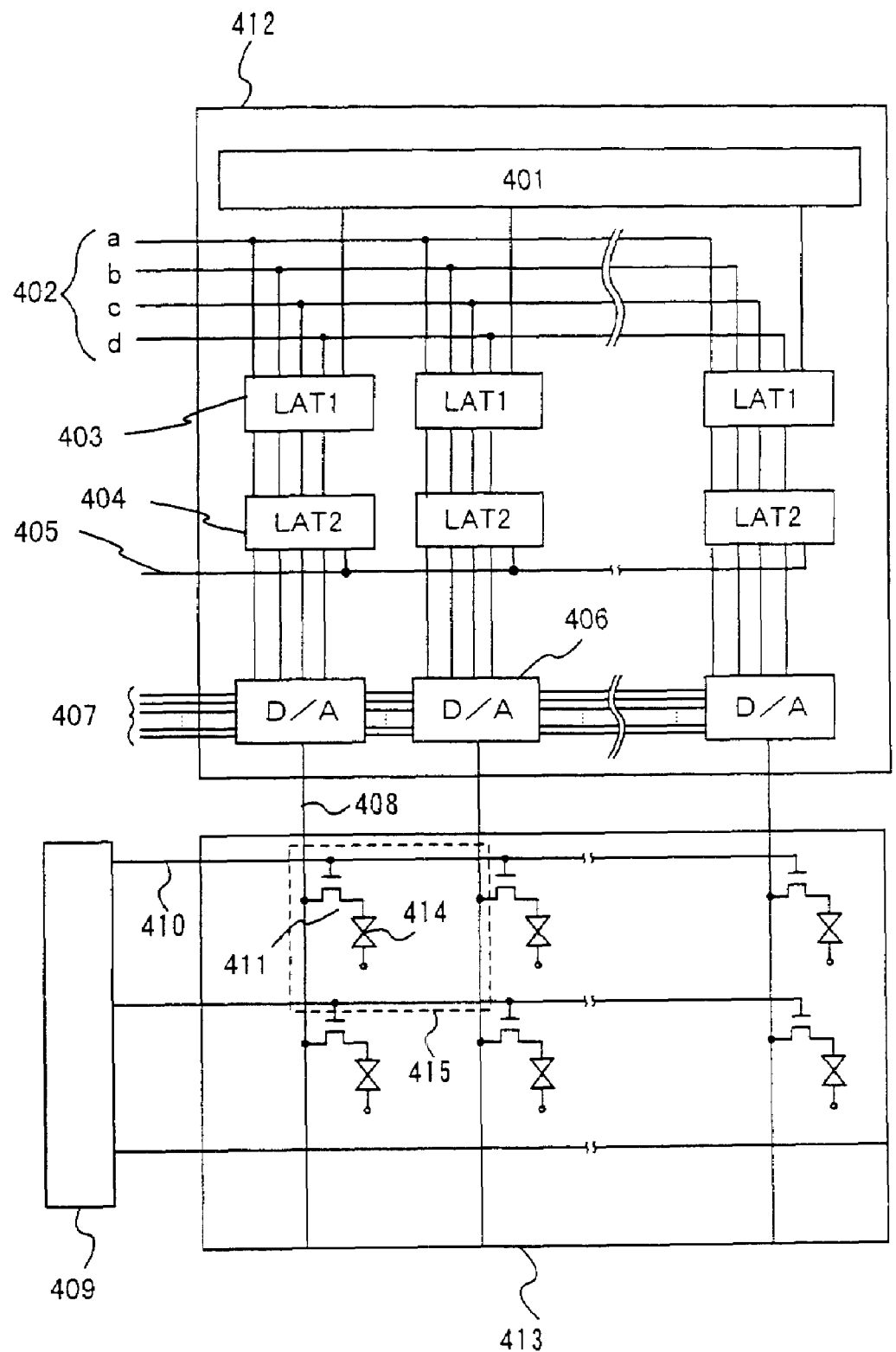
FIG. 12 is a top surface diagram of a semiconductor display device of the present invention.

FIG. 12 shows a block diagram of a semiconductor display device of the present invention driven by a digital method. An example of a semiconductor display device with a 4-bit digital drive method it taken here.

As shown in FIG. 12, a source signal line driver circuit 412, a gate signal line driver circuit 409, and a pixel portion 413 are provided in the digital drive semiconductor display device.

A shift register 401, a plurality of latches 1 (LAT1) 403, a plurality of latches 2 (LAT2) 404, and D/A converter circuits 406 are formed in the source signal line driver circuit 412. Address lines 402a to 402d of display signals inputted from the outside (a digital display signal in Embodiment 4) are connected to the latches 1 (LAT1) 403. Further, a latch pulse line 405 is connected to the latches 2 (LAT2) 404. Gray-scale voltage lines 407 are connected to the plurality of D/A converter circuits 406.

Note that, for convenience, four latches are shown combined in Embodiment 4 for the latches 1 (LAT1) 403 and the latches 2 (LAT2) 404.

Source signal lines 408 in the pixel portion 413 are connected to the D/A converter circuits 406 of the source signal line driver circuit 412, and gate signal lines 410 connected to the gate signal line driver circuit 409 are provided in the pixel portion 413.

Pixels 415 are formed in the pixel portion 413 at which the source signal lines 408 and the gate signal lines 410 intersect, and the pixels 415 each have a pixel TFT 411 and a liquid crystal cell 414.

The digital display signals supplied to the address lines 402a to 402d are written to all of the LAT1s 403 in order in accordance with a timing signal from the shift register 401. Note that all of the LAT1s 403 are referred to in this specification as a LAT1 group.

A period until writing the digital display signals to the LAT1 group is finished once is referred to as one line period. Namely, one line period is a period which starts when writing the digital display signal to the leftmost LAT1 is started and finishes when writing the digital display signal to the rightmost LAT1 is finished. Note that the period until writing the digital display signals to the LAT1 group is finished once may also be combined with a horizontal return period, and the result may be taken as one line period.

After completing write-in of the digital display signals to the LAT1 group, the digital display signal inputted to the LAT1 group is sent to and written into all of the LAT2s 404 at once, in accordance with a latch signal inputted to the latch pulse lines 405. Note that all of the LAT2s are referred to as the generic name LAT2 group in this specification.

After transferring the digital display signals to the LAT2 group, the second line period starts. Writing the digital display signal supplied to the address lines 402a to 402d to the LAT1 group in order is therefore performed again in accordance with the timing signal from the shift register 401.

The digital display signals written into the LAT2 group are all inputted at once to the D/A converter circuits 406 at the same time as the second line period begins. The input digital display signals are then converted in the D/A converter circuit 406 to analog display signals having voltages corresponding to the image information of the digital display signals, and are inputted to the source signal lines 408.

Switching of corresponding pixel TFTs 411 is performed in accordance with a selection signal outputted from the gate signal line driver circuit 409, and liquid crystal molecules are driven by the analog display signals inputted to the source signal lines 408.

By changing values of gray-scale voltages inputted to the gray-scale voltage lines 407 every frame period in Embodiment 4, the polarity of the analog display signal outputted from the D/A converter circuits 406 is changed. The voltage of the gray scale voltage lines is determined in a gray-scale voltage power source. Driving of the gray-scale voltage power source is explained in detail below.

Figure 23:
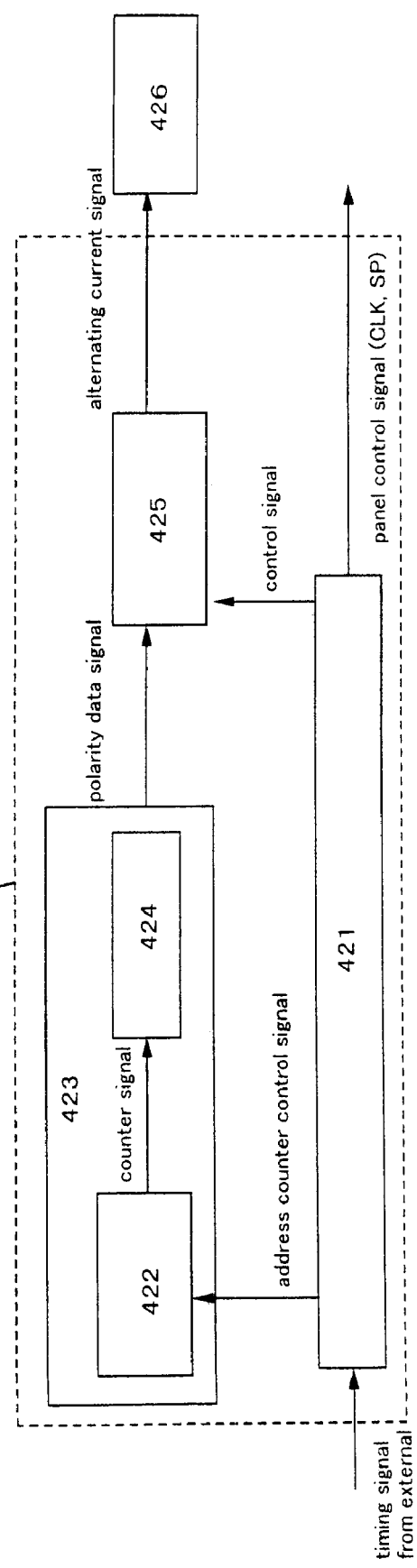
FIG. 23 is a block diagram of a gray-scale voltage control portion and a gray-scale voltage power source for generating an alternating current signal of a semiconductor display device of the present invention.

A gray-scale voltage control portion 420 and a gray-scale voltage power source 426 are shown in FIG. 23. The gray-scale voltage control portion 420 has a control portion 421, a polarity data signal generation portion 423, and an alternating current signal generation portion 425.

Panel control signals, address counter control signals, and control signals are generated in the control portion 412 in accordance with a timing signal inputted to the control portion 421 from external of the control portion 421. The panel control signals are signals such as a clock signal CLK and a start pulse signal SP, which are inputted to the source signal line driver circuit and the gate signal line driver circuit.

The address counter signals and the control signals are inputted to an address counter 422 and to the alternating current signal generation portion 425, respectively, from the control portion 421.

The polarity data signal generation portion 423 is a portion for generating polarity data signals. The polarity data signals have information (polarity data) regarding the polarity of the display signals inputted to all of the pixels.

The address counter 422 and a memory 424 are provided in the polarity data signal generation portion 423 in Embodiment 4. Note that the Embodiment 4 is not limited to the above structure. The polarity data signal generation portion may have any type of structure, provided that it can generate polarity signals having information (polarity data) regarding the polarity of the display signals inputted into all of the pixels.

The address counter control signals inputted to the polarity data signal generation portion 423 are inputted to the address counter 422. The address counter 422 is driven in accordance with the input address counter control signals, and generates counter signals. The counter signals have counter value as information for specifying an address of the memory 424. Information (polarity data) regarding the polarity of the display signals inputted to all of the pixels is stored in the memory 424.

The m types of polarity data are stored in the memory 424 from address 0 to address (m−1). The address of the memory 424 is specified by the counter value of the generated counter signal. For example, when the counter value is 0, address 0 of the memory circuit 424 is specified, address 1 is specified when the counter value is 1, address 2 is specified when the counter value is 2, and address (m−1) is specified when the counter value is (m−1).

Note that when the values from 0 to (m−1) are taken as the counter value, values from 0 to (m−1) are once again used. In other words, once the address values from 0 to (m−1) of the memory circuit 424 are all specified, specification begins again from the address 0 to the address (m−1). There is no particular order in which the counter values are taken, and values may be taken in order from 0 to (m−1, and they may also be taken randomly.

The number m of polarity data is greater than 2, and may be any value provided that flicker, vertical striping, and horizontal striping observed on a screen by a viewer can be suppressed when compared to that of a conventional example. The greater the number m of polarity data, the more that flicker, vertical striping, and horizontal striping observed on a screen by a viewer can be suppressed.

When the polarity data stored in the addresses of the memory 424 are specified by the counter signal, a polarity data signal having the polarity data as information is generated in the polarity data signal generation portion 423. The generated polarity data signal is inputted to the alternating current signal generation portion 425.

The alternating current signal generation portion 425 is driven by a control signal input from the control portion 421, and generates an alternating current signal from the input polarity data signal. The alternating current signal has information on the polarity of the display signals inputted to each pixel, and its waveform is an alternating current waveform. The generated alternating current signal is inputted to the gray-scale voltage power source 426.

When the alternating current signal is inputted in the gray-scale voltage power source 426, the values of the gray-scale voltages inputted to the gray-scale voltage lines 407 are controlled in accordance with the information in the alternating current signal on the polarity of the display signals inputted to each pixel. The polarity of analog displays signals outputted from the D, A converter circuits 406 is controlled by controlling the value of the gray-scale voltage.

The analog display signals outputted from the D/A converter circuits 406 are inputted to each source signal line.

A driving method of the present invention as shown in the embodiment modes is realized in accordance with the above structure.

Note that the gray-scale voltage control portion 420 and the gray-scale voltage power source 426, shown in FIG. 23, in order to form a display signal is formed on an IC chip (a semiconductor circuit formed by MOSFETs formed on single crystal silicon) as an external circuit. The gray-scale voltage control portion 420 and the gray-scale voltage power source 426 are then connected to the source signal line driver circuit and to the gate signal line driver circuit formed on the active matrix substrate through an FPC (flexible printed circuit). The present invention is not limited to the above stated structure, however, and a structure in which the source signal line driver circuit is also formed on an IC chip with the gray-scale voltage control portion 420 and the gray-scale voltage power source 426 may also be used. Furthermore, a portion of, or the entire gray-scale voltage control portion 420 may also be formed on the active matrix substrate, and a portion of, or the entire gray-scale voltage power source 426 may also be formed on the active matrix substrate.

Embodiment 5

An example of a method of manufacturing a liquid crystal display device which is one of a semiconductor display device of the present invention is explained using FIGS. 13 to 16. A method of manufacturing a pixel TFT and a storage capacitor of a pixel portion, and a source signal line driver circuit TFT and a gate signal line driver circuit TFT formed in the periphery of the pixel portion, at the same time is explained in detail here in accordance with process steps.

In FIG. 13A, a glass substrate such as barium borosilicate glass or aluminum borosilicate glass, typically Corning Corp. #7059 or #1737 glass, or a quartz substrate is used as a substrate 501. When using a glass substrate, heat treatment may be performed in advance at a temperature between 10 and 20° C. below the distortion temperature of the glass. A base film 502 is then formed from an insulating film such as a silicon oxide film, a silicon nitride film, or a silicon nitride oxide film on the surface of the substrate 501 on which a TFT will be formed, in order to prevent impurity element diffusion. For example, a lamination of a silicon nitride oxide film 502a having a thickness of 10 to 200 nm (preferably between 50 and 100 nm) and manufactured by plasma CVD using $SiH_4$, $NH_3$, and $N_2O$, and a hydrogenated silicon nitride oxide film 502b having a thickness of 50 to 200 nm (preferably between 100 and 150 nm) and manufactured similarly from $SiH_4$ and $N_2O$ is formed. A two layer structure is shown for the base film 502 here, but a single layer film of the above insulating films, or a lamination film having more than two layers may also be formed.

The silicon nitride oxide film 502a is formed using a parallel plate type plasma CVD method. For the silicon nitride oxide film 502a, $SiH_4$, $NH_3$, and $N_2O$ are introduced to a reaction chamber at 10 SCCM, 100 SCCM, and 20 SCCM, respectively, the substrate temperature is set to 325° C., the reaction pressure is 40 Pa, the emission power density is set to 0.41 W/cm$^2$, and the emission frequency is 60 MHZ. On the other hand, for the hydrogenated silicon nitride oxide film 502b, $SiH_4$, $N_2O$, and $H_2$ are introduced to the reaction chamber at 5 SCCM, 120 SCCM, and 125 SCCM, respectively, the substrate temperature is set to 400° C., the reaction pressure is 20 Pa, the emission power density is set to 0.41 W/cm$^2$, and the emission frequency is 60 MHZ. These films can be formed in succession by changing the substrate temperature and switching the reaction gasses.

The silicon nitride oxide film 502a thus manufactured has a density of $9.28 \times 10^{22}/cm^3$ and a slow etching speed of approximately 63 nm/min when etched by a mixed solution containing 7.13% ammonium bifluoride ($NH_4HF_2$) and 15.4% ammonium fluoride ($NH_4F$) (Stella Chemifa Corporation, product name LAL500) at 20° C., namely, the silicon nitride film is dense and hard film. If this type of film is used as the base film, it is effective in preventing diffusion of alkaline metal elements from the glass substrate into the semiconductor layer formed on the base film.

Next, an amorphous semiconductor layer 503a having an amorphous structure is formed by a method such as plasma CVD or sputtering to a thickness of 25 to 80 nm (preferably between 30 and 60 nm). Semiconductor films having an amorphous structure include amorphous semiconductor layers and microcrystalline semiconductor films, and a chemical compound semiconductor film having an amorphous structure such as an amorphous silicon germanium film may also be applied. When an amorphous silicon film is formed as the amorphous semiconductor layer 503a by plasma CVD, it is possible to form both the base film 502 and the amorphous semiconductor layer 503a in succession. For example, as stated above, after forming the silicon nitride oxide film 502a and the hydrogenated silicon nitride oxide film 502b successively by plasma CVD, the amorphous semiconductor layer 503a can be formed in succession without exposure to the atmosphere by switching the reaction gasses from $SiH_4$, $N_2O$, and $H_2$ to $SiH_4$ and $H_2$ or merely $SiH_4$. As a result, it becomes possible to prevent contamination of the surface of the hydrogenated silicon nitride oxide film 502b, and a dispersion in the characteristics of the manufactured TFTs and fluctuations in their threshold voltage can be lowered.

A crystallization process is then performed, and a crystalline semiconductor layer 503b is manufactured from the amorphous semiconductor layer 503a. Laser annealing, thermal annealing (solid phase growth method), and rapid thermal annealing (RTA method) can be applied as the crystallization method. When using a glass substrate such as those stated above, or a plastic substrate with inferior heat resistance, it is particular preferable to apply laser annealing. A light source such as an infrared lamp, a halogen lamp, a metal halide lamp, or a xenon lamp is used by the RTA method. Alternatively, the crystalline semiconductor layer 503b can be formed bin a crystallization method using a catalytic element, in accordance with a technique disclosed by Japanese Patent Application Laid-open No. Hei. 7-130652. In this crystallization process, first it is preferable to release hydrogen contained in the amorphous semiconductor layer, and if the crystallization is performed after the amount of hydrogen contained is made equal to or less than 5 atom % by performing heat treatment at 400 to 500° C. for approximately 1 hour, then roughness of the film surface can be prevented.

Further, $SiH_4$ and argon (Ar) are used as a reaction gas in a process of forming an amorphous silicon film by plasma CVD, and if the substrate temperature is set from 400 to 450° C. at the time of film deposition, then the concentration of hydrogen contained within the amorphous silicon film can also be made equal to or less than 5 atomic %. The heat treatment for releasing hydrogen becomes unnecessary in this case.

When performing crystallization by laser annealing, a pulse emission type or a continuous emission type excimer laser, or an argon laser is used as the light source. Laser light is processed into a linear shape and then laser annealing is performed in the case where a pulse emission type excimer laser is used. The conditions of laser annealing may be suitably determined by the operator, but for example, the laser pulse emission frequency is set to 30 Hz, and the laser energy density is set from 100 to 500 mJ/cm$^2$ (typically between 300 and 400 mJ/cm$^2$). The linear shape beam is then irradiated over the entire surface of the substrate, and this is performed with an overlap ratio of 80 to 98% for the linear shape beam. Thus the crystalline semiconductor layer 503b can be obtained, as shown in FIG. 13B.

A resist pattern is then formed using a photolithography technique employing a first photomask (PM1) on the crystalline semiconductor layer 503b. The crystalline semiconductor layer is then partitioned into island-like shapes by dry etching, forming the island-like semiconductor layers 504 to 508, as shown in FIG. 13C. A gas mixture of $CF_4$ and $O_2$ is used in the dry etching of the crystalline silicon film.

An impurity element which imparts p-type conductivity may then be added at a concentration of about $1\times10^{16}$ to $5\times10^{17}$ atoms/cm$^3$ to the entire surface of the island-like semiconductor layers, with an aim of controlling the threshold voltage (Vth) of the TFTs. Elements in periodic table group 13, such as boron (B), aluminum (Al), and gallium (Ga) are known as impurity elements which will impart p-type conductivity with respect to semiconductors. Ion injection and ion doping (or ion shower doping) can be used as the method of adding the impurity element, though ion doping is suitable for processing a large area substrate. Boron (B) is added by ion doping using diborane ($B_2H_6$) as a source gas. This type of impurity element injection is not always necessary and may be omitted without any hindrance. In particular it is a method appropriately used in order to keep the threshold voltage of an n-channel TFT within a predetermined range.

A gate insulating film 509 is formed with a thickness of 40 to 150 nm from an insulating film containing silicon by plasma CVD or sputtering. In Embodiment 5, a 120 nm thick silicon nitride oxide film is used to form the gate insulating film 509. Further, a silicon nitride oxide film formed by adding $O_2$ to $SiH_4$ and $N_2O$ has a reduced fixed charge density within the film therefore it is a preferable material for this type of use. Furthermore, a silicon nitride oxide film manufactured from $SiH_4$, $N_2O$ and $H_2$ is preferable since it has a lowered defect density in the boundary with the gate insulating film. Of course, as the gate insulating film is not limited to this type of the silicon nitride oxide film, other insulating films containing silicon may also be used, in a single layer or a lamination layer structure. For example, when using a silicon oxide film, it can be formed by plasma CVD with a mixture of TEOS (tetraethyl orthosilicate) and $O_2$, at a reaction pressure of 40 Pa, with the substrate temperature set from 300 to 400° C., and by discharging at a high frequency (13.56 MHZ) electric power density of 0.5 to 0.8 W/cm$^2$. Good characteristics as a gate insulating film can be obtained by subsequently performing thermal annealing of the silicon oxide film thus manufactured at 400 to 500° C. (FIG. 13C)

A heat resistant conductive layer 511 for forming a gate electrode is then formed with a thickness of 200 to 400 nm (preferably between 250 and 350 nm) on the first shape gate insulating film 509, as shown in FIG. 13D. The heat resistant conductive layer 511 may be formed by a single layer and may also be a lamination structure composed of a plurality of layers such as a two layers or three layers structure, if necessary. In the heat resistant conductive layer contains an element chosen from the group consisting of Ta, Ti, and W or an alloy of the above elements, or an alloy film of a combination of said elements. These heat resistant conductive layers are formed by sputtering or CVD, and it is preferable to reduce the impurity element concentration contained in order to make the resistance low. In particular, it is preferable to make the concentration of oxygen equal to or less than 30 ppm. A 300 nm thick W film is formed in Embodiment 5. The W film may be formed by sputtering with W as a target, and can also be formed by thermal CVD using tungsten hexafluoride ($WF_6$). Whichever is used, it is necessary to be able to make the film become low resistance in order to use as the gate electrode, and it is preferable that the resistivity of the W film be made equal to or less than 20 μΩcm. The resistivity can be lowered by enlarging the crystals of the W film, but for cases in which there are a many impurity elements such as oxygen within the W film, crystallization is inhibited, and the film becomes high resistance. Thus a W target having a purity of 99.9999% is used in sputtering, and by additionally forming the W film taking sufficient care so as not to introduce any impurities from within the gas phase at the time of film deposition, a resistivity of 9 to 20 μΩcm can be achieved.

When a Ta film is used in the heat resistant conductive layer 511, it is possible to form the Ta film similarly by sputtering. Ar is used in the sputtering gas for the Ta film. Further, if an appropriate amount of Xe and Kr are added to the gas at the time of sputtering, then the internal stress of the film formed is relaxed, and film peeling can be prevented. The resistivity of an α phase Ta film is on the order of 20 μΩcm, and it can be used in the gate electrode, but the resistivity of a β phase Ta film is on the order of 180 μΩcm and it is unsuitable for the gate electrode. A TaN film possesses a crystal structure which is close to that of the α phase Ta film, and therefore an α phase Ta film can easily be obtained provided that a TaN film is formed under the Ta film. Further, although not shown in the figures, it is effective to form a silicon film doped with phosphorous (P) and having a thickness on the order of 2 to 20 nm under the heat resistant conductive layer 511. By doing so, increasing the adhesion and preventing oxidation of the conductive film formed on top can be achieved, at the same time, alkaline metal elements contained in the heat resistant conductive layer 511 in microscopic amounts can be stopped from diffusing into the first shape gate insulating, film 509. Whichever is used, it is preferable that the resistivity of the heat resistant conductive layer 511 be in a range from 10 to 50 μΩcm.

Next, masks 512 to 517 formed from resists are formed by a photolithography technique using a second photomask (PM2). A first etching process is then performed. The etching is performed in Embodiment 5 using an ICP etching apparatus, using $Cl_2$ and $CF_4$ as etching gasses, inputting an RF (13.56 MHZ) power of 3.2 W/cm$^2$ at 1 Pa of pressure to form a plasma. A 224 mW/cm$^2$ RF (13.56 MHZ) power is also introduced to the substrate side (sample stage), and therefore a negative self bias voltage is effectively applied. The etching speed of the W film is approximately 100 nm/min under these conditions. The etching time in order to exactly etch the W film is estimated based on this etching speed, further an etching time for the first etching process is set at 20% more greater than the estimated etching time.

Conductive layers having a first tapered shape 518 to 523 are formed by the first etching process. The angle of the tapered portions of the conductive layers 518 to 523 is formed from 15 to 30°. In order to perform etching without leaving any residual, over etching is performed in which the etching time is increased by a ratio on the order of 10 to 20%. The selectivity of a silicon nitride oxide film (the first shape gate insulating film 509) with respect to the W film is between 2 and 4 (typically 3), and therefore the exposed surface of the silicon nitride oxide film is etched on the order of 20 to 50 nm by the over etching process, and a second shape gate insulating film 580, in which a tapered shape is formed in near the edge portion of the conductive layers 518 to 523 having the first tapered shape, is formed.

A first doping process is then performed, adding one conductivity type impurity element into the island-like semiconductor layers. A process of adding an impurity element which imparts n-type conductivity is performed here. The masks 512 to 517 for forming the first shape conductive layers are left as it is, and with the first tapered shape conductive layers 518 to 524 are used as a mask, the impurity element which imparts n-type conductivity is added by ion doping in a self-aligning manner. The ion doping is performed using a dosage amount of $1\times10^{13}$ to $5\times10^{14}$ atoms/cm$^2$ and with the acceleration voltage set between 80 and 160 keV in order for the n-type conductivity imparting impurity element to be added so as to pass through the tapered portion in the edge portion of the gate electrode and through the second shape gate insulating film 580, and so as to reach the semiconductor layers placed below. A periodic table group 15 element is used as the impurity element which imparts n-type conductivity, typically phosphorous (P) or arsenic (As), and phosphorous (P) is used here. The impurity element which imparts n-type conductivity is added to first impurity regions 524 to 528 here by the ion doping process at a concentration in the range of $1\times10^{20}$ to $1\times10^{21}$ atoms/cm$^3$. Although there is not necessarily a uniform concentration within second impurity regions (A) 529 to 533 formed below the tapered portion, the n-type conductivity imparting impurity element is added within a range of $1\times10^{17}$ to $1\times10^{20}$ atoms/cm$^3$. FIG. 14A.

The change in concentration of the n-type conductivity imparting impurity element contained in a portion of second impurity regions (A) 529 to 533 overlapping at least the first shape conductive layers 518 to 523 reflects the change in thickness of the tapered portion. In other words, the concentration of phosphorous (P) added to the second impurity regions (A) 529 to 533 gradually becomes less from the edge portion of the conductive layers toward the inside in the region overlapping with the first shape conductive layers 518 to 523. The concentration of phosphorous (P) reaching the semiconductor layers changes due to the difference in a film thickness of the tapered portion.

A second etching process is performed next, as shown in FIG. 14B. The etching process is also similarly performed by an ICP etching apparatus with a mixed gas of $CF_4$ and $Cl_2$ used in the etching gas, the etching is performed with an RF power of 3.2 W/cm$^2$ (13.56 MHZ), a bias power of 45 mW/cm$^2$ (13.56 MHZ), and at a pressure of 1.0 Pa. Conductive layers having a second shape 540 to 545 formed under this conditions are formed. A tapered portion is formed in each edge portions, and this becomes a tapered shape in which the thickness gradually increases from the edge portion toward the inside. Compared with the first etching process, the ratio of anisotropic etching becomes greater in the substrate side by the amount that the applied bias power is reduced, and the angle of the tapered portion becomes from 30 to 60°. Masks 512 to 517 are etched and the edge portion thereof are cut to form masks 534 to 539. Further, the surface of the second shape gate insulating film 580 is etched on the order of 40 nm, newly forming a third shape gate insulating film 570.

An impurity element which imparts n-type conductivity is then doped at conditions of a dosage amount lower than that of the first doping process, and at a high acceleration voltage. For example, the acceleration voltage is set between 70 and 120 keV, and doping is performed with a dosage amount of $1\times10^{13}$ atoms/cm$^2$, so as to make the impurity concentration in a region overlapping with the second shape conductive layers 540 to 545 be from $1\times10^{16}$ and $1\times10^{18}$ atoms/cm$^3$. Second impurity regions (B) 546 to 550 are thus formed.

Impurity regions 556 and 557, having inverse conductivity type of the above mentioned conductivity type, are then formed in the island-like semiconductor layers 504 and 506 which form p-channel TFTs. The second shape conductive layers 540 and 542 are used as a mask in this case as well, and an impurity element which imparts p-type conductivity is added. The impurity regions are formed in a self-aligning manner. The island-like semiconductor layers 505, 507, and 508, which form n-channel TFTs, are covered over their entire surfaces by resist masks 551 to 553, formed using a third photomask (PM3). Impurity regions 556 and 557 formed here are formed by ion doping using diborane ($B_2H_6$). The concentration of the p-type conductivity imparting impurity element in the impurity regions 556 and 557 is set so as to become $2\times10^{20}$ to $2\times10^{21}$ atoms/cm$^3$.

However, in detail the impurity regions 556 and 557 can be seen as being divided into three regions containing n-type conductivity imparting impurity elements. Third impurity regions 556a and 557a contain the impurity element which imparts n-type conductivity at a concentration of $1\times10^{20}$ to $1\times10^{21}$ atoms/cm$^3$, fourth impurity regions (A) 556$b$ and 557$b$ contain the impurity element which imparts n-type conductivity at a concentration of $1\times10^{17}$ and $1\times10^{20}$ atoms/cm$^3$, and fourth impurity regions (B) 556$c$ and 557$c$ contain a concentration of the n-type conductivity imparting impurity element from $1\times10^{16}$ and $5\times10^{18}$ atoms/cm$^3$. However, the concentration of the impurity element which imparts p-type conductivity is set so as to be equal to or greater than $1\times10^{19}$ atoms/cm$^3$ in the impurity regions 556$b$, 556$c$, 557$b$, and 557$c$, and in the third impurity regions 556$a$ and 557$a$, the concentration of the p-type conductivity imparting impurity element is made to be from 1.5 to 3 times as high, and therefore no problems will develop when the third impurity regions function as a source region and a drain region of a p-channel TFT. Further, a portion of the fourth impurity regions (B) 556$c$ and 557$c$ is formed so as to overlap with a portion of the second tapered shape conductive layer 540 or 542.

Figure 15A:
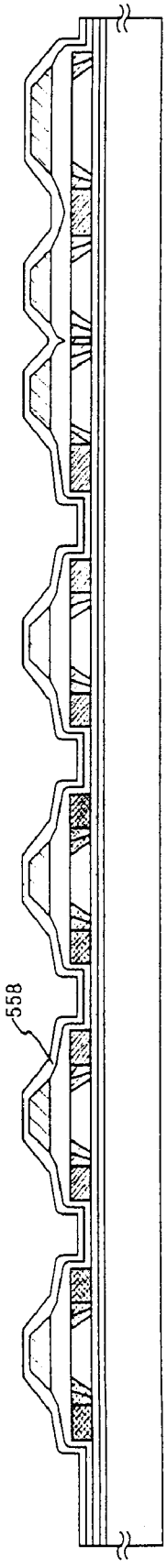
FIGS. 15A and 15B are diagrams showing the process of manufacturing the semiconductor display device.

Next, as shown in FIG. 15A, a first interlayer insulating film 558 is formed on the second shape conductive layers 540 to 545 and the gate insulating film 570. The first interlayer insulating film 558 may be formed by a silicon oxide film, a silicon nitride oxide film, a silicon nitride film, or a lamination film of a combination of these films. Whichever is used, the first interlayer insulating film 558 is formed from an inorganic insulating material. The film thickness of the first interlayer insulating film 558 is set from 100 to 200 nm. When a silicon oxide film is used as the first interlayer insulating film 558 here, it can be formed by plasma CVD with a mixture of TEOS and O$_2$, at a reaction pressure of 40 Pa, with the substrate temperature set from 300 to 400° C., and by discharging, at a high frequency (13.56 MHZ) electric power density of 0.5 to 0.8 W/cm$^2$. Further, when a silicon nitride oxide film is used as the first interlayer insulating film 558, a silicon nitride oxide film manufactured by plasma CVD from SiH$_4$, N$_2$O, and NH$_3$, or the silicon nitride oxide film manufactured from SiH$_4$ and N$_2$O may be used. The manufacturing conditions in this case are a reaction pressure of 20 to 200 Pa, a substrate temperature set from 300 to 400° C., and the film can be formed by applying a high frequency (60 MHZ) electric power density of 0.1 to 1.0 W/cm$^2$. Further, a hydrogenated silicon nitride oxide film manufactured from SiH$_4$, N$_2$O, and H$_2$ may also be applied as the first interlayer insulating film 558. It is also possible to manufacture a silicon nitride film from SiH$_4$, and NH$_3$ similarly by plasma CVD.

A process of activating the n-type or p-type conductivity imparting impurity element added at their respective concentrations is then performed. Thermal annealing using an annealing furnace is performed for this process. In addition, laser annealing and rapid thermal annealing (RTA) can also be applied. Thermal annealing is performed with an oxygen concentration equal to or less than 1 ppm, preferably equal to or less than 0.1 ppm, in a nitrogen atmosphere at 400 to 700° C., typically between 500 and 600° C. Heat treatment is performed for 4 hours at 550° C. in Embodiment 5. Further, it is preferable to apply laser annealing when a plastic substrate having a low heat resistance temperature is used as the substrate 501.

After the activation process the gas atmosphere is changed, and heat treatment is performed for 1 to 12 hours at 300 to 450° C. in an atmosphere containing between 3 and 100% hydrogen, performing hydrogenation of the island-like semiconductor layers. This process is one of terminating from $10^{16}$ to $10^{18}$/cm$^3$ of dangling bonds in the island-like semiconductor layers by hydrogen which is thermally excited. Plasma hydrogenation (using hydrogen excited by a plasma) may also be performed as another means of hydrogenation.

Whichever is used, it is preferable to reduce the defect density within the island-like semiconductor layers 504 to 508 to $10^{16}$/cm$^3$ or less, and hydrogen may be imparted on the order of 0.01 to 0.1 atomic %.

Then, a second interlayer insulating film 559 made from an organic insulator material is formed at an average thickness of 1.0 to 2.0 µm. The organic resin material includes polyimide, acrylic, polyamide, polyimide amide, or BCB (benzocyclobutene). For example, when thermal polymerization type polyimide is used, the second interlayer insulating film is formed by baking at 300° C. in a clean oven after application to the substrate. Also, when acrylic is used, two liquids are used. After combining a main material and a hardening agent, this is applied to the entire surface of the substrate using a spinner, and pre-heat treatment is performed for 60 seconds at 80° C. on a hot plate. In addition, the substrate is baked for 60 minutes at 250° C. in a clean oven, thereby the second interlayer insulating film can be formed.

In this way, the surface can be finely leveled by forming the second interlayer insulating film 559 from an organic insulator material. Further, organic resin materials generally have a low dielectric constant, and therefore the parasitic capacitance can be reduced. However, organic resin materials absorb moisture and are not suitable for a protecting film, and therefore it is also preferable to use a combination of films such as a silicon oxide film, a silicon nitride oxide film, and a silicon nitride film formed as the first interlayer insulating film 558.

Next, a resist mask is formed with a predetermined pattern using a fourth photomask (PM4), and contact holes are formed in each of the island-like semiconductor layers in order to reach the impurity regions formed as source regions or drain regions. The contact holes are formed by dry etching. In this case, the second interlayer insulating film 559 made from an organic resin material is etched using a gas mixture of CF$_4$, O$_2$, and He. Afterward, the first interlayer insulating film 558 is etched in succession using an etching gas of CF$_4$ and O$_2$. In addition, the contact holes can be formed by etching the third shape gate insulating film 570, where the etching gas is switched to CHF$_3$ in order to increase the selectivity with the island-like semiconductor layers.

A conductive metallic film is then formed by sputtering or vacuum evaporation, and a resist mask pattern is formed by a fifth photomask (PM5). Source lines 560 to 564 and drain lines 565 to 568 are formed by etching. A pixel electrode 569 is formed with the drain lines. A pixel electrode 571 denotes a pixel electrode of an adjacent pixel. Although not shown in the figures, in Embodiment 5, Ti films are formed with a thickness of 50 to 150 nm, contacts with the impurity regions forming the source or drain regions of the island-like semiconductor layers are formed, aluminum (Al) films having a thickness of 300 to 400 nm is formed on the Ti film, and in addition, transparent conductive films with a thickness of 80 to 120 nm are formed on the aluminum film for the wirings. An indium oxide zinc oxide alloy (In$_2$O$_3$—ZnO) or zinc oxide (ZnO) is the material applied suitably to the transparent conductive film, and in addition, a material such as zinc oxide in which gallium (Ga) has been added (ZnO:Ga) in order to increase the transmittivity of visible light and to increase the conductivity can also be used preferably.

The substrate, having the driver circuit (source signal line driver circuit and gate signal line driver circuit) TFTs and the pixel TFTs of the pixel portion on the same substrate, can thus be completed by using 5 photomasks. A first p-channel TFT 600, a first n-channel TFT 601, a second p-channel TFT 602, and a second n-channel TFT 603 are formed in the driver circuit, and a pixel TFT 604 and a storage capacitor 605 are formed in the pixel portion. This type of substrate is referred to as an active matrix substrate throughout this specification for convenience.

In the first p-channel TFT 600, a conductive layer having the second tapered shape functions as a gate electrode 620. The structure of the island-like semiconductor layer 504 has a channel forming region 606, a third impurity region 607*a* which functions as a source region or a drain region, a fourth impurity region (A) 607*b* which forms an LDD region not overlapping the gate electrode 620, and a fourth impurity region (B) 607*c* which forms an LDD region overlapping a portion of the gate electrode 620.

In the first n-channel TFT 601, a conductive layer having the second tapered shape functions as a gate electrode 621. The structure of the island-like semiconductor layer 505 has a channel forming region 608, a first impurity region 609*a* which functions as a source region or a drain region, a second impurity region (A) 609*b* which forms an LDD region not overlapping the gate electrode 621, and a second impurity region (B) 609*c* which forms an LDD region overlapping a portion of the gate electrode 621. The length of the portion in which the second impurity region (B) 609*c* overlaps the gate electrode 621 is set from 0.1 to 0.3 μm with respect to a channel length of 2 to 7 μm. This length Lov is controlled by the thickness of the gate electrode 621 and by the angle of the tapered portion. By forming this type of LDD region in an n-channel TFT, the high electric field which develops near the drain region is relieved, and the development of hot carriers is blocked, then deterioration of the TFT can be prevented.

In the second p-channel TFT 602 of the driver circuit, a conductive layer having the second tapered shape similarly functions as a gate electrode 622. The structure of the island-like semiconductor layer 506 has a channel forming region 610, a third impurity region 611*a* which functions as a source region or a drain region, a fourth impurity region (A) 611*b* which forms an LDD region not overlapping the gate electrode 622, and a fourth impurity region (B) 611*c* which forms an LDD region overlapping a portion of the gate electrode 622.

In the second n-channel TFT 603 of the driver circuit, a conductive layer having the second tapered shape functions as a gate electrode 623. The structure of the island-like semiconductor layer 507 has a channel forming region 612, a first impurity region 613*a* which functions as a source region or a drain region, a second impurity region (A) 613*b* which forms an LDD region not overlapping the gate electrode 623, and a second impurity region (B) 613*c* which forms an LDD region overlapping a portion of the gate electrode 623. The length of the portion in which the second impurity region (B) 613*c* overlaps the gate electrode 623 is set similar to that of the second n-channel TFT 601, from 0.1 to 0.3 μm.

Figure 15B:
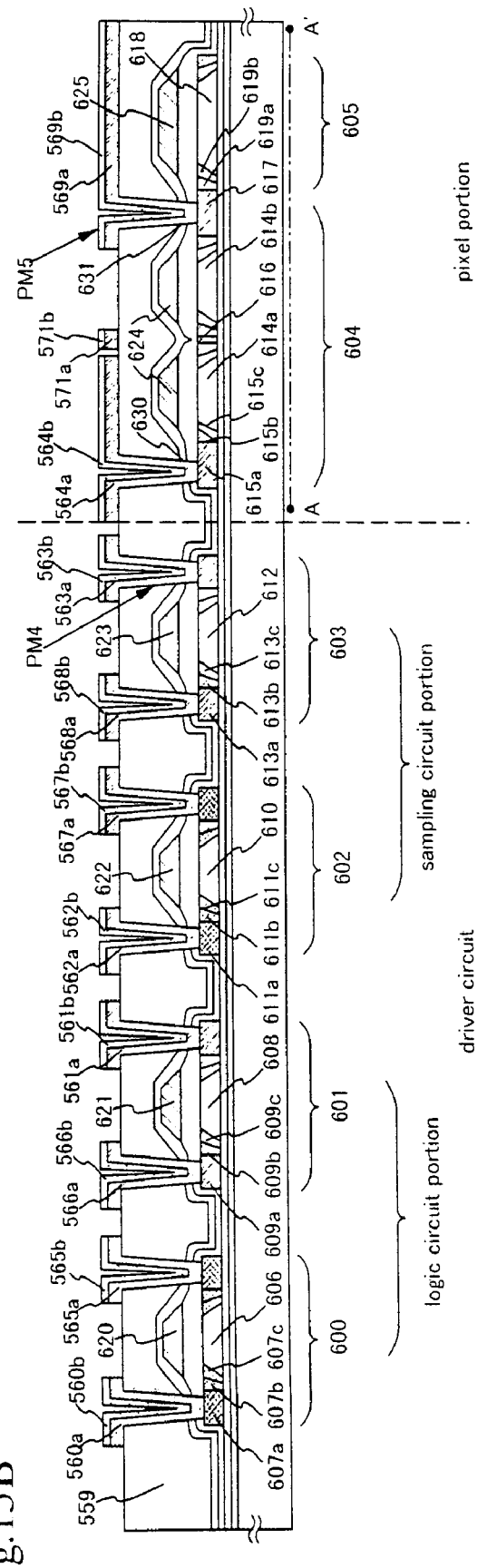

The driver circuit includes logic circuits such as a shift register circuit and a buffer circuit, and a sampling circuit formed by an analog switch. In FIG. 15B, TFTs for forming these circuits are shown by a single gate structure in which one gate electrode is formed between a source and drain pair, but a multi-gate structure in which a plurality of gate electrodes are formed between source and drain pairs may also be used without hindrance.

In the pixel TFT 604, a conductive layer having the second tapered shape functions as a gate electrode 624. The structure of the island-like semiconductor layer 508 has channel forming regions 614*a* and 614*b*, first impurity region 615*a* and 617 which function as source regions or drain regions, a second impurity region (A) 615*b* which forms an LDD region not overlapping the gate electrode 624, and a second impurity region (B) 615*c* which forms an LDD region overlapping a portion of the gate electrode 624. The length of the portion in which the second impurity region (B) 613*c* overlaps the gate electrode 624 is set from 0.1 to 0.3 μm. Further, a storage capacitor 605 is formed from: a semiconductor layer which extends from the first impurity region 617 and has a second impurity region (A) 619*b*, a second impurity region (B) 619*c*, and a region 618 to which is not added impurity elements determining the conductivity type; an insulating layer formed by the same layer as the gate insulating film having the third shape; and a capacitor wiring 625 formed from the second tapered shape conductive layer.

In the pixel TFT 604, a gate electrode 624 intersects, through a gate insulating film 570, with the island-like semiconductor layer 508 formed below and stretches over a plurality of island-like semiconductor layers furthermore to serve as the gate signal line. The storage capacitor 605 is formed by a region in which the semiconductor layer extending from the drain region 627 of the pixel TFT 604 and the capacitor wiring 625 overlap, through the gate insulating film 570. An impurity element for controlling valence electrons is not added in the semiconductor layer 618 in this structure.

A structure such as that above optimizes the structure of the pixel TFT and TFTs composing each circuits of the driver circuit in response to the specifications required, and it is possible to increase the operating performance and the reliability of the semiconductor device. In addition, by forming the gate electrode using a conductive material having heat resistance, the LDD regions, and source regions and drain regions are easily activated. Moreover, when forming the LDD region overlapping the gate electrode through the gate insulating film, in particular it can be expected that the relieving effect for the electric field formed near the drain region will increase by forming the LDD region to possess a concentration gradient of an impurity element added with the aim of controlling the conductivity type.

In the case of an active matrix type liquid crystal display device, the first p-channel TFT 600 and the first n-channel TFT 601 are used to form circuits such as a shift register circuit, a buffer circuit, and a level shifter circuit which place importance on high speed operation. In FIG. 15B, these circuits are denoted as a logic circuit portion. The second impurity region (B) 609*c* of the first n-channel TFT 601 becomes a structure which places importance on counteracting hot carriers. In addition, in order to increase voltage resistance and stabilize operation, the TFTs of the logic circuit portion may have a double gate structure in which two gate electrodes are formed between one source and drain pair, and this type of TFT can be similarly manufactured by using the processes of Embodiment 5.

Further, in a sampling circuit structured by analog switches, the second p-channel TFTs 602 and the second n-channel TFTs 603 having the same structure as a logic circuit portion can be applied. Since the sampling circuit places importance on measures against hot carriers and low Off current operation, the second p-channel TFT 602 has a triple gate structure in which three gate electrodes are formed between one source and drain pair, and this type of TFT can be similarly manufactured by using the processes of Embodiment 5. Taking the length of the LDD region which overlaps the gate electrode as Lov, its length in the longitudinal direction of the channel is set from 0.1 to 0.3 μm with respect to a channel length of 3 to 7 μm.

Thus, whether to use a single gate structure for the structure of the TFT gate electrode, or to use a multi-gate structure in which a plurality of gate electrodes are formed between one source and drain pair, may be suitably determined by the operator, in accordance with the circuit characteristics.

Then, as shown in FIG. 16A, a spacer which is a cylindrical spacer is formed on the active matrix substrate of a state shown in FIG. 15B. The spacer may be formed by sprinkling particles of a size of several microns. Here, however, the spacer is formed by forming a resin film on the whole surface of the substrate followed by patterning. Though not limited to the above material only, the spacer may be formed by, for example, applying NN700 manufactured by JSR Co. by using a spinner and exposing it to light and developing it to form in a predetermined pattern. The spacer is then cured by heating in a clean oven at 150° C. to 200° C. The thus formed spacer can be formed in different shapes by changing the conditions of exposure to light and developing. Desirably, however, the spacer is formed in a cylindrical shape with a flat top portion. When brought into contact with the substrate of the opposing side, then, the spacer works to maintain a mechanical strength needed for the liquid crystal display panel. The shape may be a conical shape, a pyramidal shape, or the like and there is no particular limitation on the shape. When the spacer is formed in a conical shape, however, the height may be 1.2 to 5 μm, the average radius may be 5 to 7 μm, and the ratio of the average radius to the radius of the bottom portion may be 1 to 1.5. In this case, the tapered angle of the side surface is not larger than ±15°.

The arrangement of the spacer may be arbitrarily determined. Desirably, however, the cylindrical spacer 656 is formed being overlapped on a contact portion 631 of the pixel electrode 569 in the pixel portion so as to cover this portion as shown in FIG. 16A. The contact portion 631 loses the flatness, and the liquid crystals are not favorably oriented in this portion. Therefore, the cylindrical spacer 656 is formed in a manner to fill the contact portion 631 with the spacer resin, thereby to prevent discrimination. Spacers 655a to 655e are also formed on the TFTs of the driver circuit. The spacers may be formed over the whole surface of the driver circuit portion or may be formed to cover the source wirings and the drain wirings as shown in FIG. 16A.

Then, an alignment film 657 is formed. Usually, a polyimide resin is used as an alignment film of the liquid crystal display element. After the alignment film is formed, the rubbing is effected so that the liquid crystal molecules are oriented acquiring a predetermined pre-tilted angle. The region that is not rubbed in the rubbing direction is suppressed to be not larger than 2 μm from the end of the cylindrical spacer 656 formed on the pixel portion. The generation of static electricity often becomes a problem in the rubbing treatment. However, the TFTs are protected from the static electricity due to the spacers 655a to 655e formed on the TFTs of the driver circuit. Though not shown in figure, the spacers 656, 655a to 655e may be formed after the alignment film 657 is formed.

On the opposing substrate 651 of the opposing side are formed a light-shielding film 652, a transparent conductive film 653 and an alignment film 654. The light-shielding film 652 is formed of a Ti film, a Cr film or an Al film with a thickness of 150 nm to 300 nm. The active matrix substrate on which the pixel portion and the driver circuit are formed, is stuck to the opposing substrate with a sealing material 658. The sealing material 658 contains a filler (not shown), and the two substrates are stuck together maintaining a uniform gap due to the filler and the spacers 656, 655a to 655e. Thereafter, a liquid crystal material 659 is injected between the two substrates. The liquid crystal material may be a known material. For example, there can be used anti-ferroelectric mixed liquid crystals having no threshold value exhibiting a transmission factor that continuously changes relative to the electric field and exhibiting electro-optical response characteristics, in addition to using TN liquid crystals. Some anti-ferroelectric mixed liquid crystals with no threshold value may exhibit V-shaped electro-optical response characteristics. The active matrix-type liquid crystal display device shown in FIG. 16B is thus completed.

The method of manufacturing a semiconductor display device in accordance with the present invention is not limited to this method disclosed in the present embodiment. The semiconductor display device of the present invention can be fabricated in accordance with a known method.

Note that the embodiment 5 can be freely combined with Embodiments 1 to 4.

Embodiment 6

The present invention can be used in various liquid crystal panels. In other words, the present invention can be applied to all of the semiconductor display devices (electronic equipments) having these liquid crystal panels (active matrix type liquid crystal display) as a display medium.

Such electronic equipments include a video camera, a digital camera, a projector (a rear type or a front type), a head mount display (a goggle-type display), a game machine, a car navigation system, a personal computer, a portable information terminal (a mobile computer, a portable telephone, an electronic book, or the like), or the like. FIG. 17 shows an example of such electronic equipments.

Figure 17A:
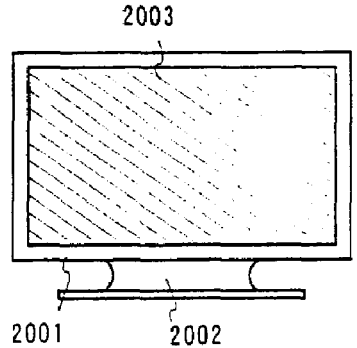
FIGS. 17A to 17F are diagrams showing electronic equipment to which the present invention is applied.

FIG. 17A illustrates a display which includes a frame 2001, a support table 2002, a display portion 2003, or the like. The present invention can be applied to the display portion 2003.

Figure 17B:
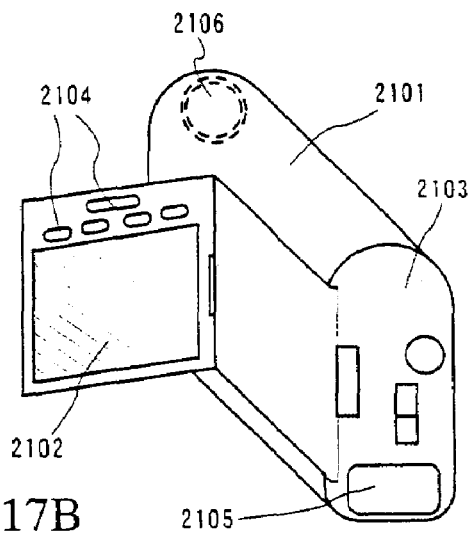

FIG. 17B illustrates a video camera which includes a main body 2101, a display portion 2102, an audio input portion 2103, operation switches 2104, a battery 2105 an image receiving portion 2106, or the like. The present invention can be applied to the display portion 2102.

Figure 17C:
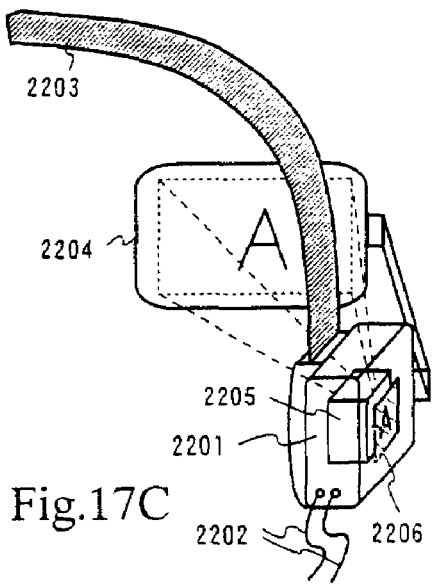

FIG. 17C illustrates a portion (the right-half piece) of a head mount type display, which includes a main body 2201, signal cables 2202, a head mount band 2203, a screen portion 2204, an optical system 2205, a display portion 2206, or the like. The present invention can be applied to the display portion 2206.

Figure 17D:
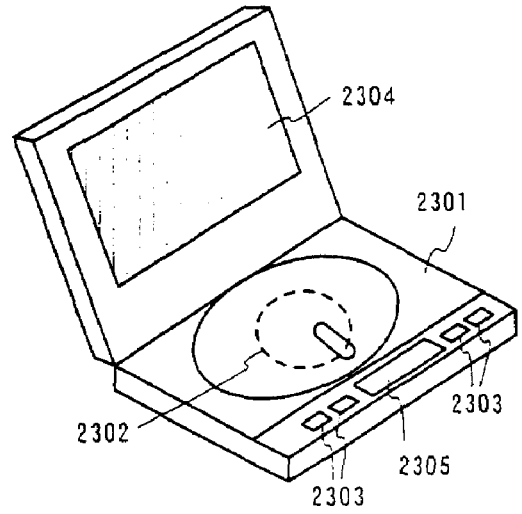

FIG. 17D illustrates an image reproduction apparatus which includes a recording medium (specifically, a DVD reproduction apparatus), which includes a main body 2301, a recording medium (a DVD or the like) 2302, operation switches 2303, a display portion (a) 2304, another display portion (b) 2305, or the like. The display portion (a) 2304 is used mainly for displaying image information, while the display portion (b) 2305 is used mainly for displaying character information. The semiconductor display device in accordance with the present invention can be used as these display portions (a) 2304 and (b) 2305. The image reproduction apparatus including a recording medium further includes a game machine or the like.

Figure 17E:
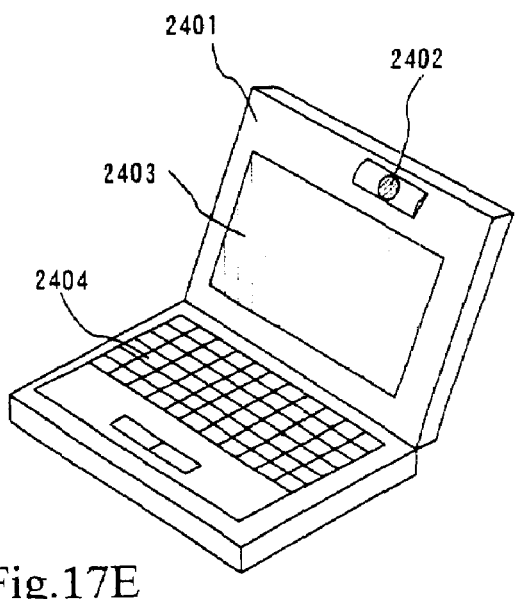

FIG. 17E illustrates a personal computer which includes a main body 2401, an image inputting portion 2402, a display portion 2403, a keyboard 2404, or the like. The present invention can be applied to the image inputting portion 2402 and the display portion 2403.

Figure 17F:
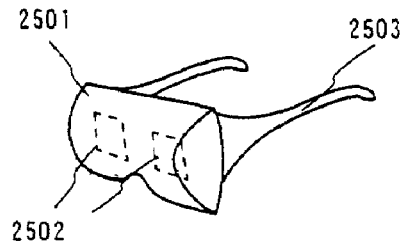

FIG. 17F illustrates a goggle type display which includes a main body 2501, a display portion 2502, and an arm portion 2503. The present invention can be applied to the display portion 2502.

The applicable range of the present invention is thus extremely wide, and it is possible to apply the present invention to electronic equipments in all fields. Also, the electronic equipments in the present embodiment can be obtained by utilizing the configuration in which the structures in Embodiments 1 through 5 are freely combined.

Embodiment 7

The present invention can be applied to projectors (rear or front type). An example of those is shown in FIGS. 18 and 19.

Figure 18A:
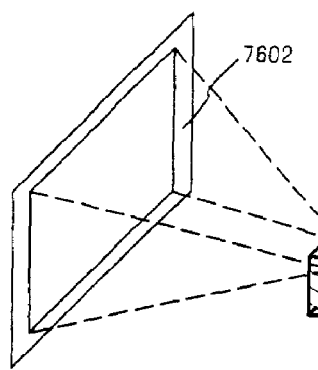
FIGS. 18A to 18D are diagrams of projectors to which the present invention is applied.

FIG. 18A is a front type projector, which includes an optical light source system and a display device 7601 and screen 7602. The present invention can be applied to the display device 7601.

Figure 18B:
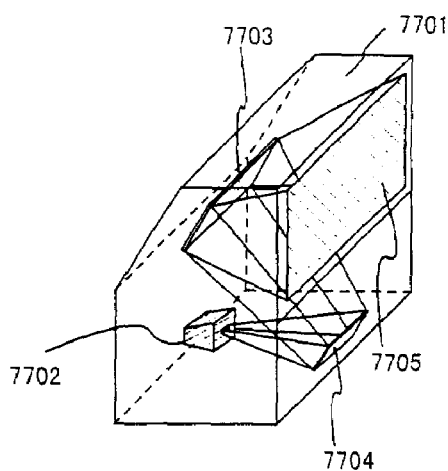

FIG. 18B is a rear type projector, which includes a main body 7701, an optical light source system and display device 7702, a mirror 7703, a mirror 7704, and a screen 7705. The present invention can be applied to the display device 7702.

Figure 18C:
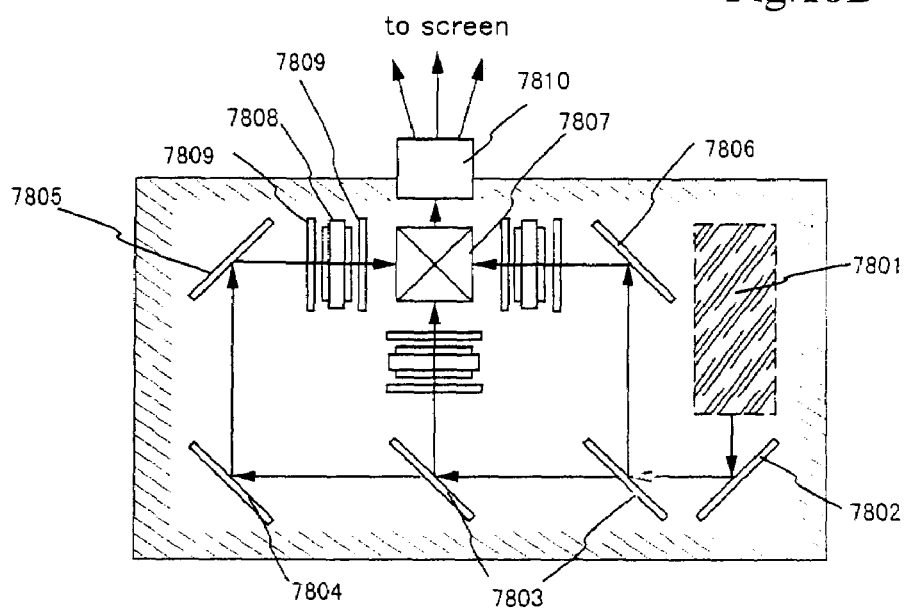

Note that FIG. 18C is a diagram showing one example of the structure of the optical light source system and display device 7601 and 7702 in FIGS. 18A and 18B. The optical light source system and display device 7601 and 7702 comprise; an optical light source system 7801; mirrors 7802 and 7804 to 7806; a dichroic mirror 7803; an optical system 7807; a display device 7808; a phase difference plate 7809; and an optical projection system 7810. The optical projection system 7810 is composed of a plurality of optical lenses provided with a projection lens. This structure is called as a three plate type since three display devices 7808 are used. Further, the operator may set optical systems such as optical lenses, films having polarizing function, films to regulate the phase difference. IR films, etc., suitably within the optical path shown by an arrow in FIG. 18C.

Figure 18D:
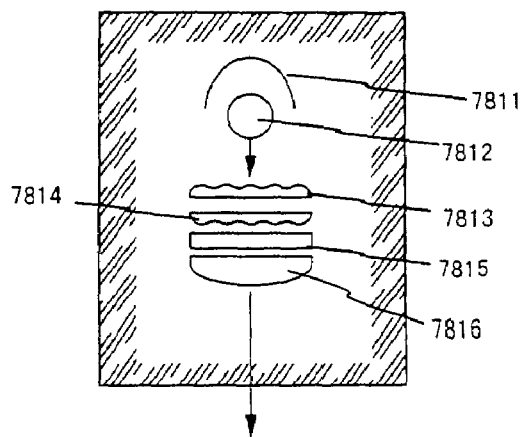

In addition, FIG. 18D shows one example of the structure of the optical light source system 7801 from FIG. 18C. In this embodiment, the optical light source system 7801 comprises: a reflector 7811; a light source 7812; lens arrays 7813 and 7814; a polarizing conversion element 7815; and a condensing lens 7816. Note that the optical light source system shown in FIG. 18D is merely an example and is not specifically limited to this structure. For example, the operator may suitably place optical lenses, films having polarizing function, films to regulate the phase difference, IR films, etc on the optical light source system.

Figure 19A:
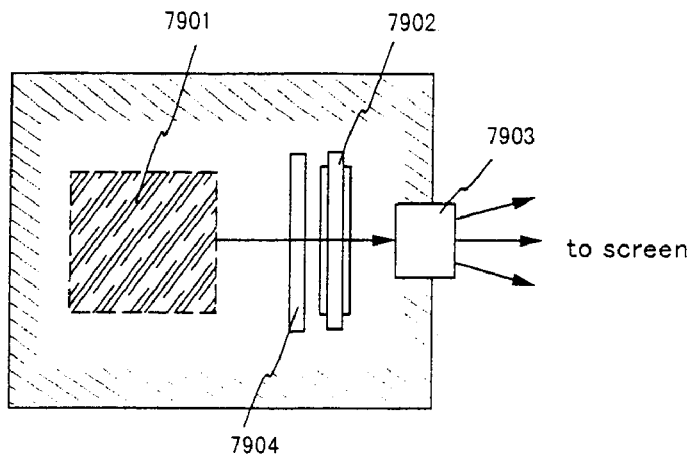
FIGS. 19A to 19C are diagrams of projectors to which the present invention is applied.

While FIG. 18C is an example of three plate type, FIG. 19A shows a drawing showing an example of single plate type. The optical light source system and display device shown in FIG. 19A comprises: an optical light source system 7901; a display device 7902; a projection optical system 7903; and phase difference plate 7904. The projection optical system 7903 comprises a plurality of optical lenses provided with a projection lens. The optical light source system and display device shown in FIG. 19A can be applied to the optical light source system and display devices 7601 and 7702 of FIGS. 18A and 18B. Further, an optical light source system shown in FIG. 18D may be used for the optical light source system 7901. Note that a color filter is provided on the display device 7902 (not shown) which makes the displayed image colored.

Figure 19B:
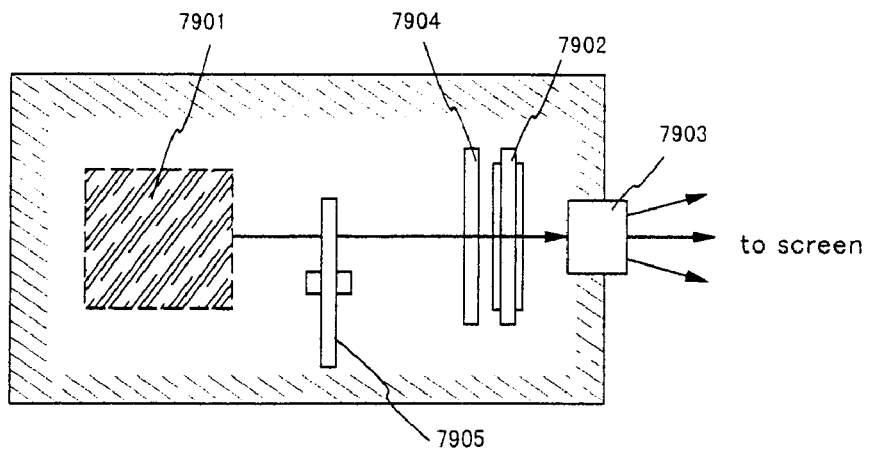

Further, the optical light source system and display device shown in FIG. 19B is an application example of FIG. 19A which uses a rotational color filter disk of RGB 7905 in place of the color filter for coloring the displayed image. The optical light source system and display device shown in FIG. 19B can be applied to the optical light source system and display devices 7601 and 7702 of FIGS. 18A and 18B.

Figure 19C:
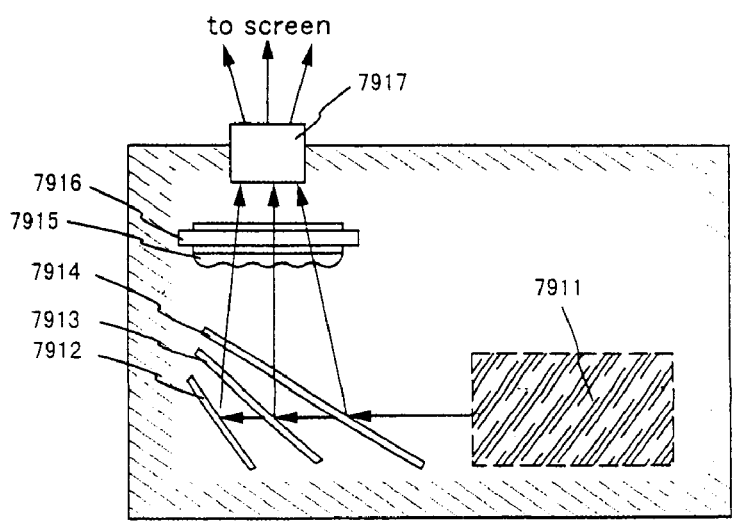
Figures 20A, 20B:
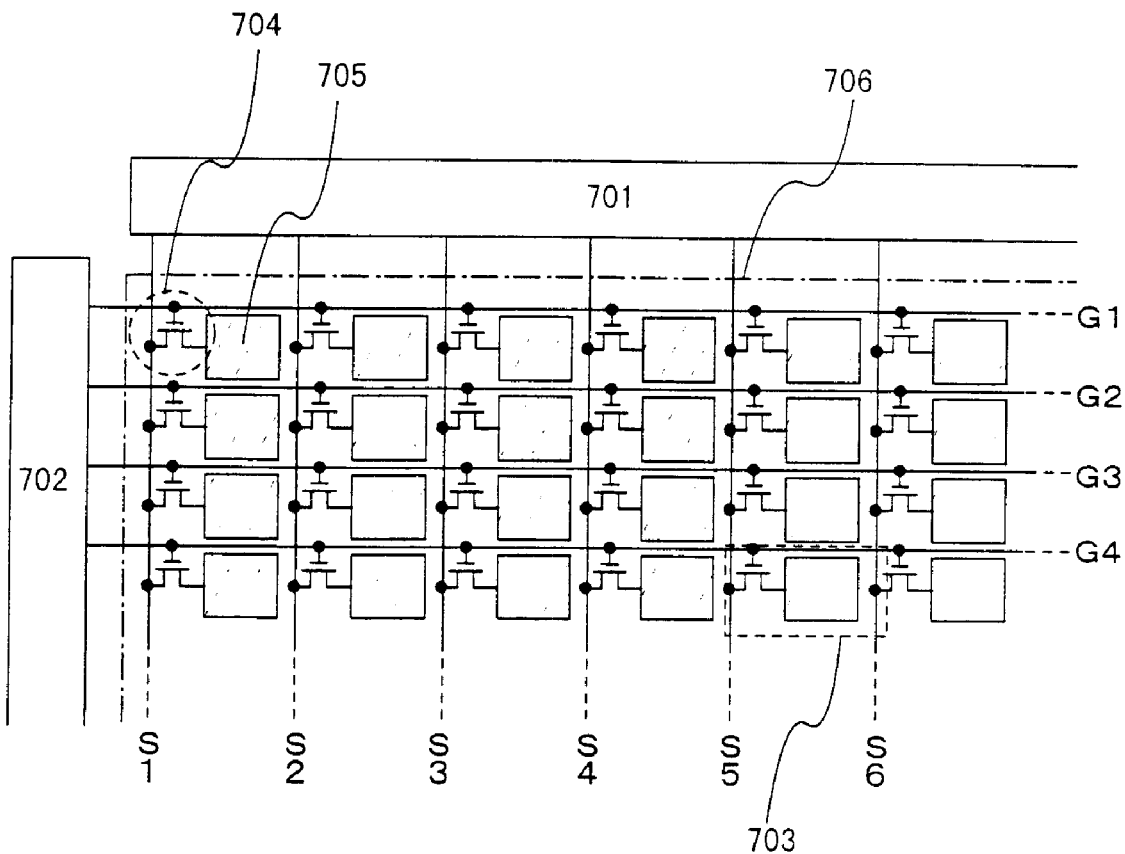
FIGS. 20A and 20B are diagrams showing a top surface view and a pixel arrangement, respectively, of an active matrix liquid crystal display device.
Figure 21A:
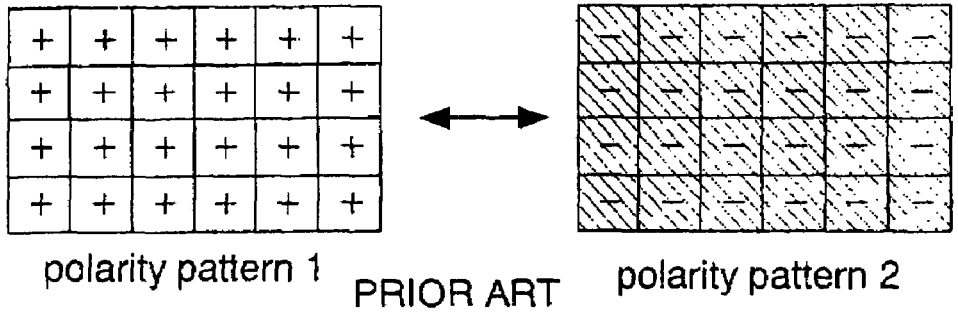
FIGS. 21A to 21D are diagrams showing polarity patterns in an alternating current drive.
Figure 21B:
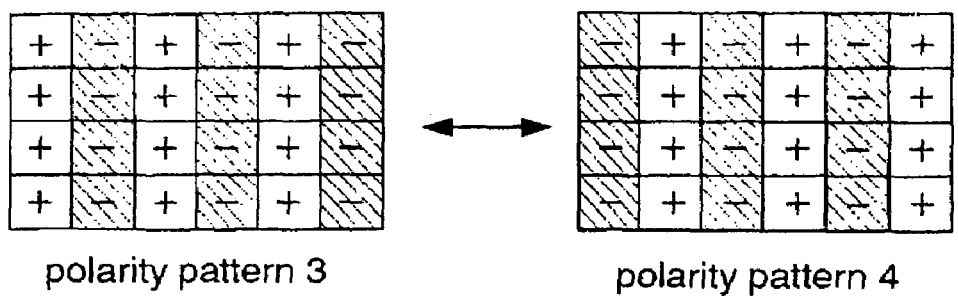
Figure 21C:
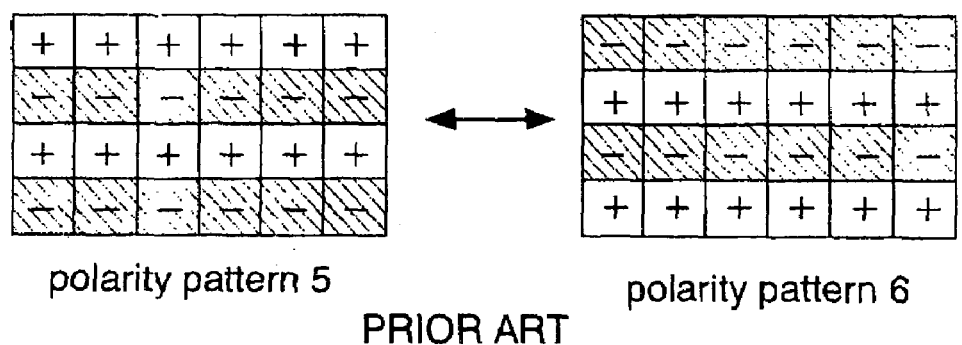
Figure 21D:
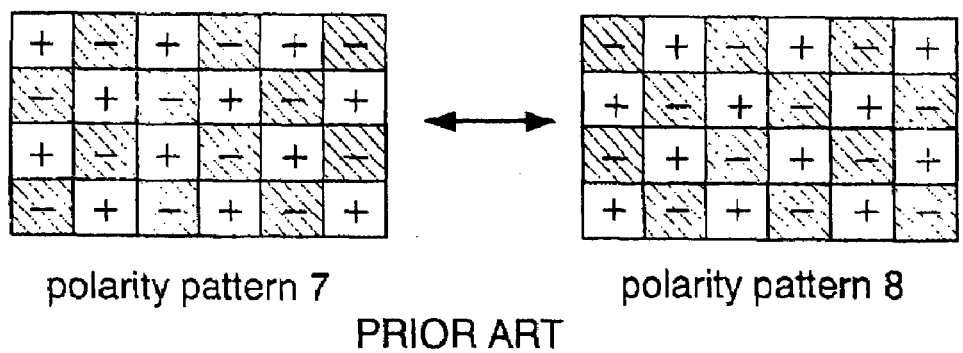
Figure 22:
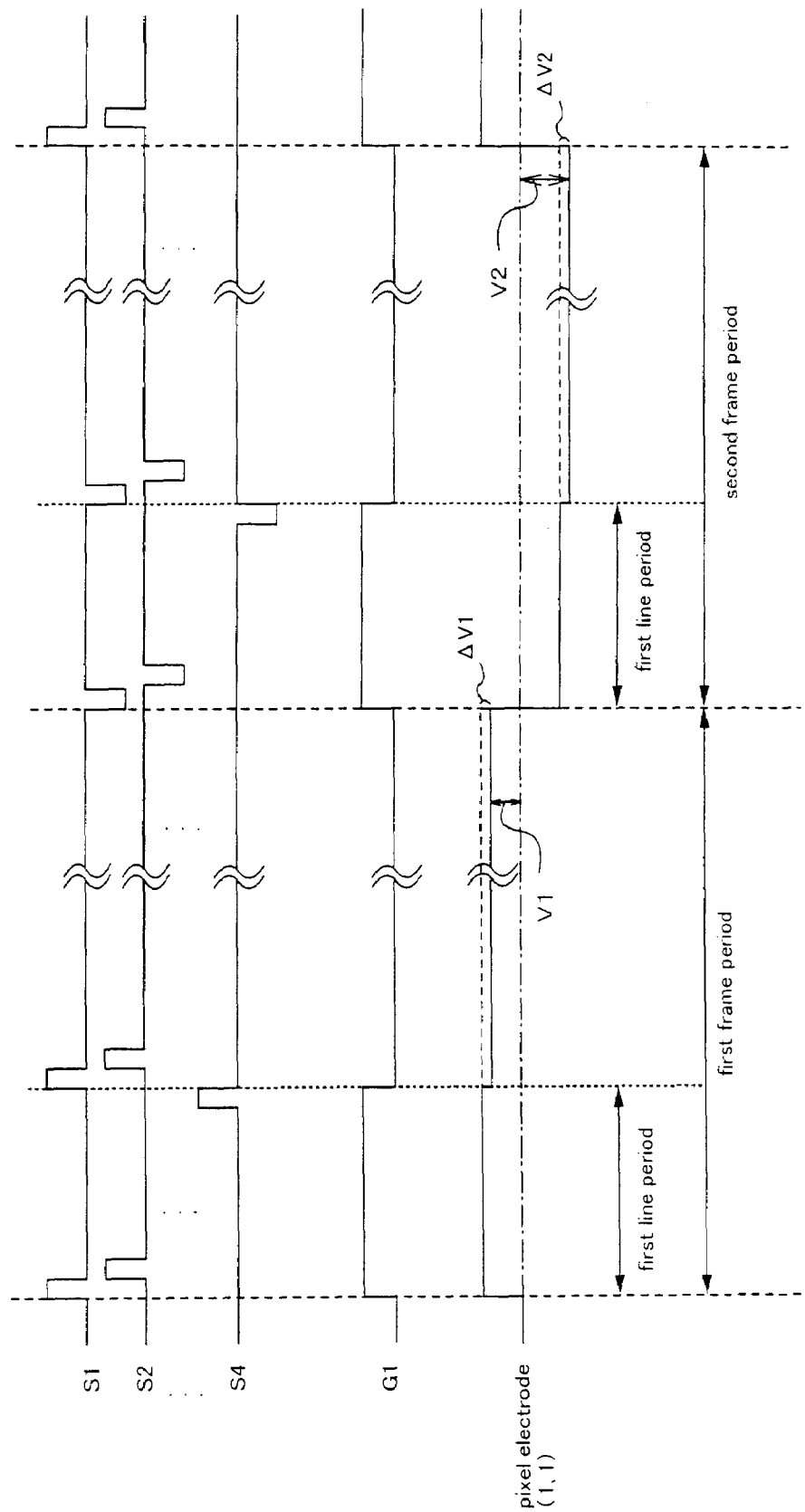
FIG. 22 is a timing chart diagram of a conventional frame inverting drive.

Further, the optical light source system and display device shown in FIG. 19C is referred to color filter-less single plate type. This system provides a micro lens array 7915 in the display device 7916 and colors the displayed image by using dichroic mirror (green) 7912, dichroic mirror (red) 7913 and dichroic mirror (blue) 7914. The projection optical system 7917 comprises a plurality of optical lenses provided with a projection lens. The optical light source system and display device shown in 19C can be applied to the optical light source system and display devices 7601 and 7702 of FIGS. 18A and 18B. Further, the optical light source system 7911 may use an optical system using a coupling lens and a collimator lens in addition to the light source.

As shown above, the applicable range of the present invention is extremely wide, and it is possible to apply the present invention to electronic equipments in all fields. The electronic equipments in the present embodiment can be obtained by utilizing the configuration in which the structures in Embodiments 1 through 5 are freely combined.

The frequency of a driver circuit for performing alternating current drive can be suppressed, and flicker, vertical striping, and horizontal striping observed on the screen by the viewer can be suppressed by using the above structure. Moreover, degradation of the liquid crystal can be suppressed by alternating current drive.

What is claimed is:

1. A method of driving a semiconductor display device, the semiconductor display device comprising:
    an opposing electrode;
    a plurality of pixels, each of which comprises:
        a pixel TFT;
        a pixel electrode; and
        a liquid crystal formed between the pixel electrode and the opposing electrode; and
    a plurality of source signal lines and a plurality of gate signal lines, each of which is electrically connected to at least one of the pixel TFTs,
    the method comprising the steps of:
        inputting display signals to the pixel electrodes of the pixels through the pixel TFTs; and
        displaying an image corresponding to the display signals during a frame period,
    wherein each of the display signals has one of a positive polarity and a negative polarity relative to an electric potential of the opposing electrode in accordance with a polarity pattern;
    wherein the polarity pattern is maintained during the frame period, and irregularly changed to another polarity pattern after the frame period;
    wherein the display signals having a same polarity are input to the pixel electrodes through the pixel TFTs connected to one of the plurality of source signal lines;
    wherein polarities of the display signals are independently controlled in each of the plurality of source signal lines; and
    wherein polarities of the display signals input to the pixel electrodes through the pixel TFTs connected to one of the plurality of source signal lines are changed together.

2. A method of driving a semiconductor display device according to claim 1, wherein a polarity of display signals input to only some of the pixel electrodes changes in two adjacent frame periods.

3. A method of driving a semiconductor display device, the semiconductor display device comprising:
    an opposing electrode;
    a plurality of pixels, each of which comprises:
        a pixel TFT;
        a pixel electrode; and
        a liquid crystal formed between the pixel electrode and the opposing electrode; and a plurality of source signal lines and a plurality of gate signal lines, each of which is electrically connected to at least one of the pixel TFTs, the method comprising the steps of:
  inputting display signals to the pixel electrodes of the pixels through the pixel TFTs; and
  displaying an image corresponding to the display signals during a frame period, wherein each of the display signals has one of a positive polarity and a negative polarity relative to an electric potential of the opposing electrode in accordance with a polarity pattern;

wherein the polarity pattern is maintained during the frame period, and irregularly changed to another polarity pattern after the frame period;

wherein the display signals having a same polarity are input to the pixel electrodes through the pixel TFTs connected to one of the plurality of gate signal lines;

wherein polarities of the display signals are independently controlled in each of the plurality of gate signal lines; and wherein polarities of the display signals input to the pixel electrodes through the pixel TFTs connected to one of the plurality of gate signal lines are changed together.

4. A method of driving a semiconductor display device according to claim 3, wherein a polarity of display signals input to only some of the pixel electrodes changes in two adjacent frame periods.

5. A semiconductor display device comprising:
a source signal line driver circuit;
a gate signal line driver circuit;
a plurality of source signal lines;
a plurality of gate signal lines;
a pixel portion; and
a display signal generation portion, wherein the pixel portion has a plurality of pixels, each containing a pixel TFT and a pixel electrode;

wherein the display signal generation portion comprises a control portion, a polarity data signal generation portion, an alternating current signal generation portion, a display signal selection portion, a + side display signal generation portion, and a − side display signal generation portion, wherein display signals are generated in the display signal generating portion and input to the plurality of source signal lines through the source signal line driver circuit;

wherein an image corresponding to the display signals is displayed during a frame period;

wherein a polarity pattern corresponding to the display signals is maintained during the frame period, and irregularly changed to another polarity pattern after the frame period;

wherein the display signals having a same polarity are input to the pixel electrodes through the pixel TFTs connected to one of the plurality of gate signal lines;

wherein polarities of the display signals are independently controlled in each of the plurality of gate signal lines; and wherein polarities of the display signals input to the pixel electrodes through the pixel TFTs connected to one of the plurality of gate signal lines are changed together.

6. A semiconductor display device according to claim 5, wherein a polarity of display signals input to only some of the pixel electrodes changes in two adjacent frame periods.

* * * * *